(12) United States Patent
Matsui et al.

(10) Patent No.: US 10,529,903 B2
(45) Date of Patent: Jan. 7, 2020

(54) LIGHT EMITTING DEVICE AND LIGHT EMITTING DEVICE PACKAGE

(71) Applicant: ROHM CO., LTD., Kyoto (JP)

(72) Inventors: Nobuaki Matsui, Kyoto (JP); Hirotaka Obuchi, Kyoto (JP); Yasuo Nakanishi, Kyoto (JP); Kazuaki Tsutsumi, Kyoto (JP); Takao Fujimori, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 62 days.

(21) Appl. No.: 15/825,851

(22) Filed: Nov. 29, 2017

(65) Prior Publication Data

US 2018/0083172 A1    Mar. 22, 2018

Related U.S. Application Data

(63) Continuation of application No. 15/054,110, filed on Feb. 25, 2016, now Pat. No. 9,991,430, which is a
(Continued)

(30) Foreign Application Priority Data

Sep. 1, 2011  (JP) ................. 2011-190880
Sep. 6, 2011  (JP) ................. 2011-193900

(51) Int. Cl.
*H01L 33/22* (2010.01)
*H01L 33/60* (2010.01)
(Continued)

(52) U.S. Cl.
CPC .......... *H01L 33/60* (2013.01); *H01L 33/0075* (2013.01); *H01L 33/22* (2013.01);
(Continued)

(58) Field of Classification Search
None
See application file for complete search history.

(56) References Cited

U.S. PATENT DOCUMENTS

2005/0174511 A1  8/2005  Sugawara et al.
2006/0157717 A1  7/2006  Nagai et al.
(Continued)

FOREIGN PATENT DOCUMENTS

JP    2001-217506 A    8/2001
JP    2005-191110 A    7/2005
(Continued)

OTHER PUBLICATIONS

JPO Office Action issued in the application JP2011-190880 dated Jul. 2, 2015.
(Continued)

*Primary Examiner* — Cory W Eskridge
(74) *Attorney, Agent, or Firm* — Rabin & Berdo, P.C.

(57) ABSTRACT

A light emitting device includes a light emitting layer, a substrate that is transparent to an emission wavelength of the light emitting layer and positioned to receive an emission wavelength from the light emitting layer, a convex pattern including a collection of a plurality of convex portions discretely arranged on a front surface of the substrate with a first pitch, an n type nitride semiconductor layer located on the front surface of the substrate to cover the convex pattern and a p type nitride semiconductor layer located on the light emitting layer. The light emitting layer is located on the n type semiconductor layer. Each of the convex portions includes a sub convex pattern comprising a plurality of fine convex portions discretely formed at the top of the convex portion with a second pitch smaller than the first pitch, and a base supporting the sub convex pattern.

17 Claims, 33 Drawing Sheets

Related U.S. Application Data continuation of application No. 14/203,385, filed on Mar. 10, 2014, now Pat. No. 9,281,444, which is a continuation of application No. 13/601,527, filed on Aug. 31, 2012, now Pat. No. 8,686,433.

(51) Int. Cl.
*H01L 33/00* (2010.01)
*H01L 33/32* (2010.01)
*H01L 33/46* (2010.01)

(52) U.S. Cl.
CPC ............. *H01L 33/32* (2013.01); *H01L 33/46* (2013.01); *H01L 2224/48091* (2013.01); *H01L 2224/49107* (2013.01); *H01L 2224/73265* (2013.01); *H01L 2933/0058* (2013.01)

(56) References Cited

U.S. PATENT DOCUMENTS

| | | | |
|---|---|---|---|
| 2008/0024402 A1 | 1/2008 | Nishikawa et al. | |
| 2008/0266896 A1 | 10/2008 | Chang | |
| 2009/0078954 A1* | 3/2009 | Shim | H01L 33/22 257/98 |
| 2010/0001289 A1 | 1/2010 | Frayssinet et al. | |
| 2010/0025684 A1 | 2/2010 | Shinohara et al. | |
| 2011/0062479 A1 | 3/2011 | Sugano et al. | |
| 2012/0124903 A1 | 5/2012 | Takeuchi | |
| 2012/0181561 A1 | 7/2012 | Fujimori et al. | |
| 2012/0181651 A1* | 7/2012 | Jiang | G01K 7/36 257/467 |

FOREIGN PATENT DOCUMENTS

| | | | |
|---|---|---|---|
| JP | 2006-500775 | A | 1/2006 |
| JP | 2007-273975 | A | 10/2007 |
| JP | 2007-311784 | A | 11/2007 |
| JP | 2008-263130 | A | 10/2008 |
| JP | 2011-006065 | * | 1/2011 |
| JP | 2011-006065 | A | 1/2011 |
| JP | 2011-009382 | A | 1/2011 |
| WO | WO-2011/016521 | A1 | 2/2011 |

OTHER PUBLICATIONS

JPO Office Action issued in the application JP2011-193900 dated Jul. 2, 2015.

* cited by examiner

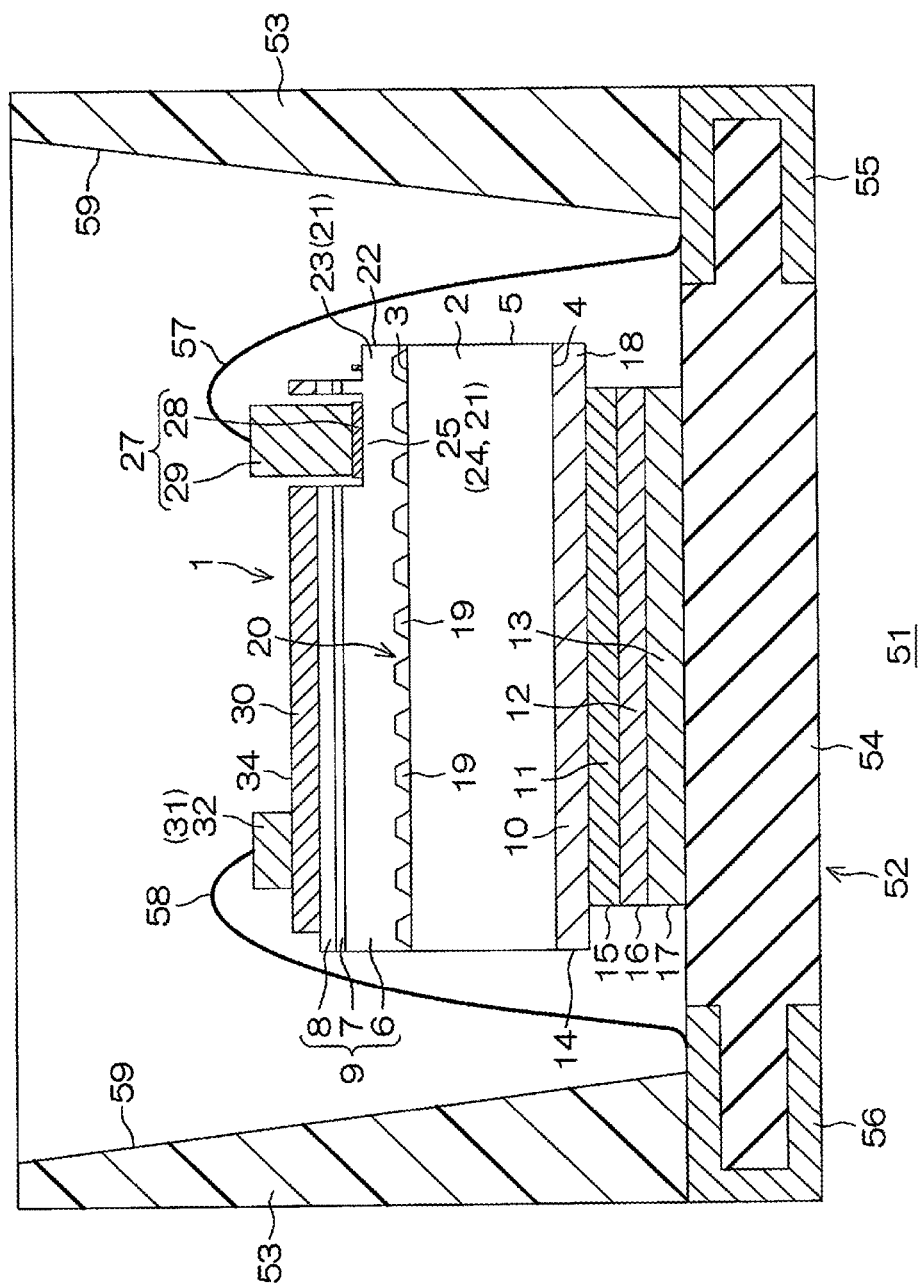

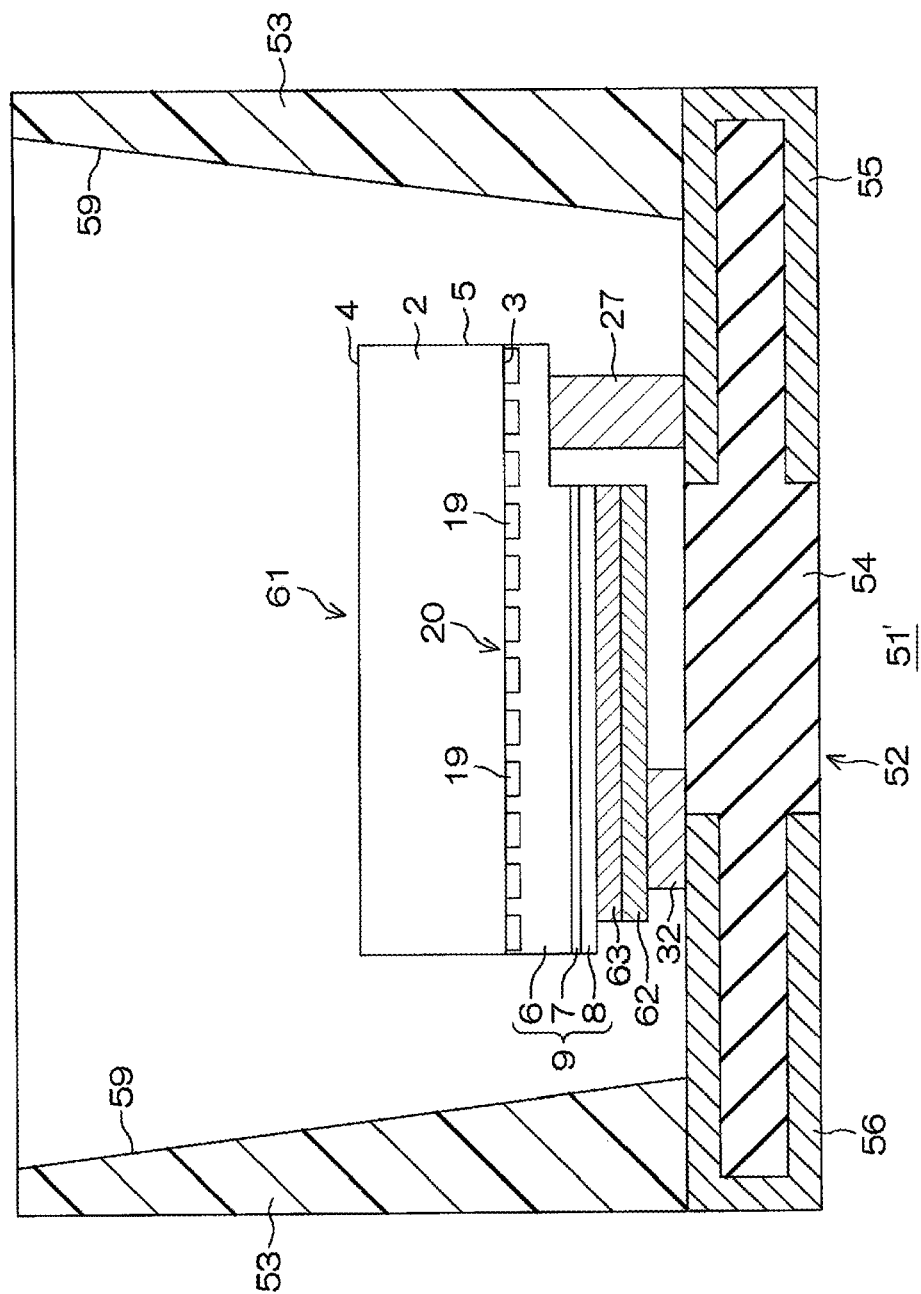

LIGHT EMITTING DEVICE AND LIGHT EMITTING DEVICE PACKAGE

CROSS-REFERENCE TO RELATED APPLICATION(S)

This is a continuation of U.S. application Ser. No. 15/054,110, filed on Feb. 25, 2016, which is a continuation of U.S. application Ser. No. 14/203,385, filed on Mar. 10, 2014 (now U.S. Pat. No. 9,281,444, issued on Mar. 8, 2016), which is a continuation of U.S. application Ser. No. 13/601,527, filed on Aug. 31, 2012 (now U.S. Pat. No. 8,686,433, issued on Apr. 1, 2014), the subject matters of which are incorporated herein by reference. These applications are based upon and claim the benefit of priority from Japanese Patent Applications No. 2011-190880, filed on Sep. 1, 2011, and No. 2011-193900, filed on Sep. 6, 2011. The disclosures of these earlier applications are incorporated herein by reference in their entirety.

TECHNICAL FIELD

The present disclosure relates to a light emitting device, a method of manufacturing the same, and a light emitting device package covering the light emitting device with a resin package.

BACKGROUND

A semiconductor light emitting device includes a substrate, a processing layer which is formed on the substrate and is processed in nano size, an n type semiconductor layer which is formed on the substrate to cover the processing layer, an active layer which is formed on the n type semiconductor layer, and a p type semiconductor layer which is formed on the active layer.

There is also a face-up type semiconductor light emitting device which includes a sapphire substrate having a front surface corresponding to a light emission surface and an opposite rear surface, and an n-GaN layer, a light emitting layer, a p-GaN layer and a transparent electrode, which are formed in order on the front surface of the sapphire substrate. In this semiconductor light emitting device, a p electrode is formed on the transparent electrode and an n electrode is formed on the n-GaN layer exposed by removing a portion of the p-GaN layer and the light emitting layer. In addition, a reflective layer, a barrier layer and an AuSn layer are formed in order on the rear surface of the sapphire substrate.

SUMMARY

The present disclosure provides, in some embodiments, a face-up type light emitting device which is capable of improving light extraction efficiency by reflecting light with a high reflectivity by a reflecting metal provided in a rear surface of a substrate and providing excellent adhesion between the reflecting metal and the substrate, and a light emitting device package including the same.

The present disclosure provides, in some embodiments, a method of manufacturing a face-up type light emitting device simply with a high precision.

The present disclosure provides, in some embodiments, a light emitting device which is capable of improving external quantum efficiency while forming an n type nitride semiconductor layer covering a convex pattern satisfactorily, and a light emitting device unit including the same.

According to one aspect of the present disclosure, there is provided a face-up type light emitting device including: a light emitting layer; a substrate having a front surface and a rear surface opposite the front surface; the substrate being transparent to an emission wavelength of a light emitting layer and located in a position to receive the emission wavelength from the light emitting layer; a nitride semiconductor stacked structure including an n type nitride semiconductor layer, the light emitting layer and a p type nitride semiconductor layer, which are stacked in order on the front surface of the substrate; a transparent adhesive layer formed on the rear surface of the substrate; a reflecting metal made of an alloy containing Ag, a Pt group metal and Cu, and formed on a rear surface of the transparent adhesive layer in contact with the transparent adhesive layer, and the reflecting metal reflecting light transmitted through the transparent adhesive layer toward the front surface of the substrate; and a bonding metal formed on a rear surface of the reflecting metal.

The expression "transparent to an emission wavelength" means that the transmissivity of the emission wavelength is, for example, equal to or more than 60%. With this configuration, when the light emitting layer emits light, most of the light transmits through the p type nitride semiconductor layer and is extracted from the opposite side (light extraction surface side) of the substrate to the light emitting layer, whereas some of the light transmits through the n type nitride semiconductor layer, the substrate 2 and the transparent adhesive layer in order, is reflected at the interface between the transparent adhesive layer and the reflecting metal, and then is extracted from the light extraction surface.

Light can be well reflected with a high reflectivity of equal to or more than 90% at the interface between the reflecting metal, which is formed of an alloy containing Ag, a Pt group metal and Cu, and the transparent adhesive layer. As a result, the extraction efficiency of light from the light emitting device can be improved, which can result in a highly luminescent light emitting device.

In addition, adhesion between the reflecting metal and the substrate can be improved by adhering the reflecting metal and the substrate together with the transparent adhesive layer interposed therebetween instead of directly adhering the reflecting metal and the substrate.

In the light emitting device according to one embodiment, the reflecting metal and the bonding metal may be formed to be accommodated in the rear surface of the transparent adhesive layer such that the rear surface of the substrate or the rear surface of the transparent adhesive layer is selectively exposed when the light emitting device is viewed from the opposite side of the light extraction surface.

According to another aspect of the present disclosure, there is provided a method of manufacturing a light emitting device, including: forming a nitride semiconductor stacked structure by stacking an n type nitride semiconductor layer, a light emitting layer and a p type nitride semiconductor layer in order on a front surface of a substrate wafer, the substrate wafer having the front surface as a light extraction surface and a rear surface opposite the front surface and being transparent to an emission wavelength of the light emitting layer; forming a transparent adhesive layer on the entire rear surface of the substrate wafer; depositing a reflecting metal on the entire rear surface of the transparent adhesive layer, the reflecting metal being formed of an alloy containing Ag, a Pt group metal and Cu; forming a bonding metal on a rear surface of the reflecting metal such that a portion of the reflecting metal is selectively exposed along a planned cutting line of the substrate wafer; selectively exposing a portion of the transparent adhesive layer along the planned cutting line by removing the exposed portion of the reflecting metal by etching; forming a division guide groove along the planned cutting line on the exposed transparent adhesive layer and the substrate wafer by a process from the rear surface of the substrate wafer; and dividing the substrate wafer along the division guide groove.

According to another aspect of the present disclosure, there is provided a method of manufacturing a light emitting device, including: forming a nitride semiconductor stacked structure by stacking an n type nitride semiconductor layer, a light emitting layer and a p type nitride semiconductor layer in order on a front surface of a substrate wafer, the substrate wafer having the front surface as a light extraction surface and a rear surface opposite the front surface and being transparent to an emission wavelength of the light emitting layer; forming a transparent adhesive layer on the entire rear surface of the substrate wafer; forming a mask on a rear surface of the transparent adhesive layer to selectively cover a portion of the transparent adhesive layer along a planned cutting line of the substrate wafer; depositing a reflecting metal and a bonding metal on the mask and the transparent adhesive layer exposed from the mask, the reflecting metal being formed of an alloy containing Ag, a Pt group metal and Cu; lifting off, together with the mask, a portion of the reflecting metal and the bonding metal on the mask and leaving the reflecting metal and the bonding metal to selectively expose a portion of the transparent adhesive layer along the planned cutting line; forming a division guide groove along the planned cutting line on the exposed transparent adhesive layer and the substrate wafer by a process from the rear surface of the substrate wafer; and dividing the substrate wafer along the division guide groove.

With these methods, since the reflecting metal and the bonding metal are formed such that a portion of the transparent adhesive layer is selectively exposed along the planned cutting line and the reflecting metal and the bonding metal do not exist on the planned cutting line, the division guide groove along the planned cutting line can be simply formed in the transparent adhesive layer and the substrate wafer. In addition, since the transparent adhesive layer is disposed on the planned cutting line of the substrate wafer, highly precise alignment (positioning) can be provided when the division guide groove is formed.

In addition, since the division guide groove is formed by a process (for example, laser irradiation) from the rear surface of the substrate wafer, there is no direct damage of the n type nitride semiconductor layer, the light emitting layer and the p type nitride semiconductor layer stacked on the front surface of the substrate wafer, which can result in a high quality light emitting device.

In addition, in the method of manufacturing the semiconductor device according to the former embodiment, since the reflecting metal is first formed on the entire rear surface of the transparent adhesive layer, there is no need to form a mask such as a resist pattern or the like on the rear surface of the transparent adhesive layer when the reflecting metal is adhered to the rear surface of the transparent adhesive layer. Accordingly, when the reflecting metal is deposited on the transparent adhesive layer, foreign substances such as fragments of the mask can be prevented from being introduced into the interface between the transparent adhesive layer and the reflecting metal, which can result in high adhesiveness of the reflecting metal to the transparent adhesive layer.

On the other hand, in the method of manufacturing the semiconductor device according to the latter aspect, the reflecting metal and the bonding metal are deposited in order after forming the mask on the rear surface of the transparent adhesive layer. Accordingly, unlike the former method, foreign substances such as fragments of the mask may be introduced into the interfaces between the reflecting metal and the barrier metal and between the barrier metal and the bonding metal when the reflecting metal, the barrier metal and the bonding metal are deposited. However, by depositing the reflecting metal and the bonding metal on the pre-formed mask and then lifting off unnecessary portions of these metals, the finally-shaped reflecting metal and the bonding metal can be formed at once, which can result in simplified manufacturing process.

In some embodiments, the light emitting device may include: a lead-out portion which extends from the nitride semiconductor stacked structure in parallel to the substrate and is electrically connected to the n type nitride semiconductor layer; an n side electrode located on the lead-out portion; a transparent electrode layer located on the p type nitride semiconductor layer; and a p side electrode located on the transparent electrode layer.

In some embodiments, the reflecting metal may be formed of an AgPdCu alloy in which Pd is the Pt group metal. Alternatively, the reflecting metal may be formed of an AgPtCu alloy in which Pt is the Pt group metal. In the former case, the mixing ratio of Pd and Cu in the reflecting metal may be 0.6% and 0.2%, respectively.

By mixing Pd and Cu with Ag in the above-described mixing ratio, sulfuration which is likely to occur due to elementary Ag can be prevented.

The transparent adhesive layer may be formed of ITO or ZnO. The bonding metal may be formed of Ag, solder or an AuSn alloy.

In some embodiments, the light emitting device further includes a barrier metal interposed between the reflecting metal and the bonding metal. In this case, the barrier metal may be formed of a TiW alloy.

In some embodiments, the thickness of the substrate may be 200 μm to 300 μm and the substrate may be formed of sapphire, GaN or SiC. Further, the emission wavelength may be 450 nm.

In some embodiments, the light emitting device may further include a convex pattern composed of a collection of a plurality of convex portions discretely arranged on the front surface of the substrate at certain distances.

With this configuration, light, which is incident into an interface between the substrate and the n type nitride semiconductor layer at different angles, can be prevented from being totally reflected at the interface into the opposite side of the light extracting surface, which can result in improvement in efficiency of light extraction.

The plurality of convex portions may be arranged in a matrix form or a zigzag pattern.

According to another aspect of the present disclosure, there is provided a light emitting device package including: the light emitting device according to the first aspect; and a resin package covering the light emitting device with the resin package with the light emitting device being in a face-up posture in which the light extraction surface is directed upward.

In some embodiments, when the light emitting device includes the n side electrode, the transparent electrode layer and the p side electrode, the light emitting device package may further include: an external n side electrode and an external p side electrode which are disposed in the resin package; an n side wire connecting the n side electrode and the external n side electrode; and a p side wire connecting the p side electrode and the external p side electrode.

BRIEF DESCRIPTION OF THE DRAWINGS

FIG. 7 is a schematic sectional view of a light emitting device package.

FIG. 23 is a schematic sectional view of a light emitting device package (of a face-down type).

DETAILED DESCRIPTION

Embodiments of the present disclosure will now be described in detail with reference to the drawings.

Figure 1:
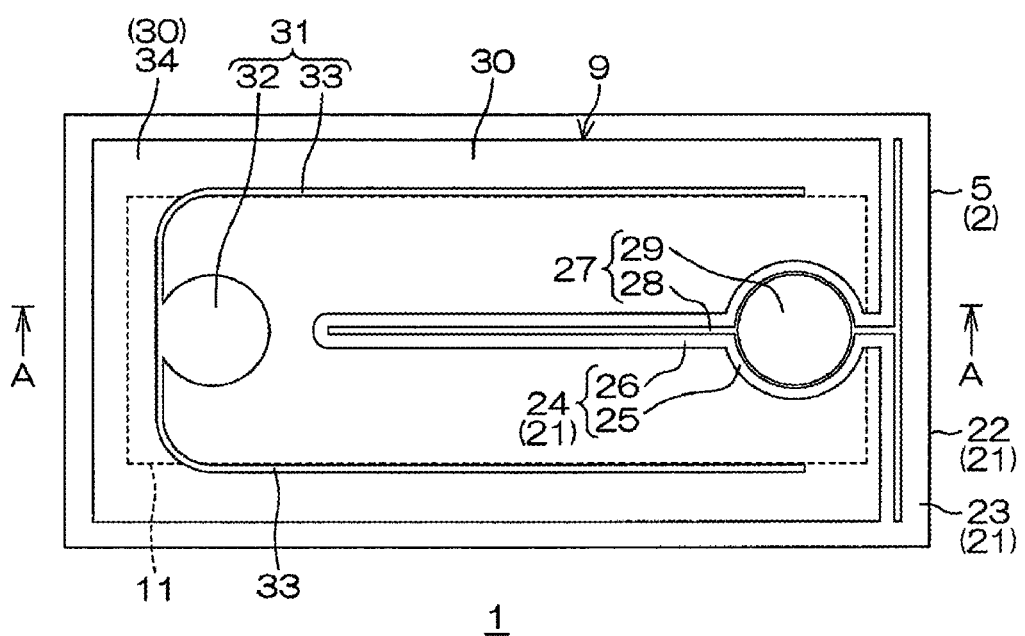
FIG. 1 is a schematic plan view of a light emitting device according to one embodiment of the present disclosure.
Figure 2:
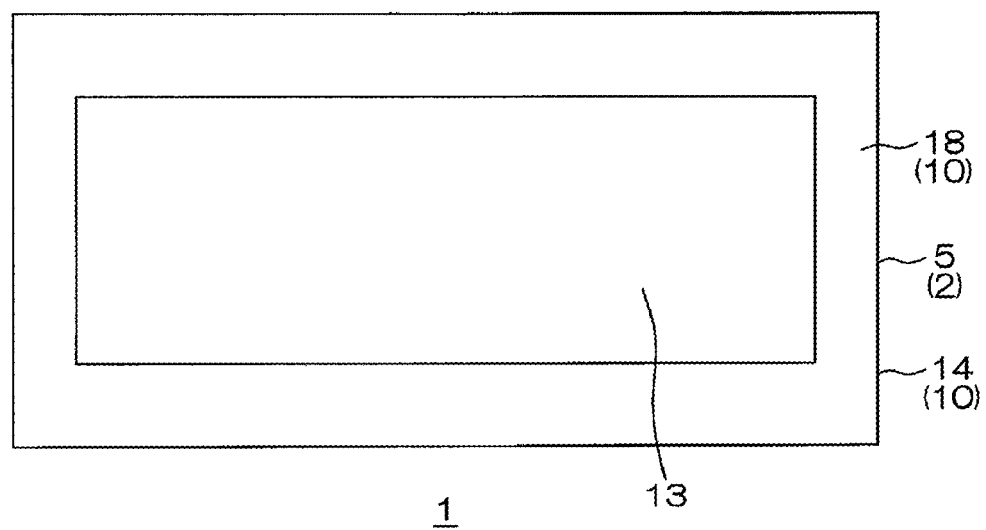
FIG. 2 is a schematic bottom view of the light emitting device of FIG. 1.
Figure 3:
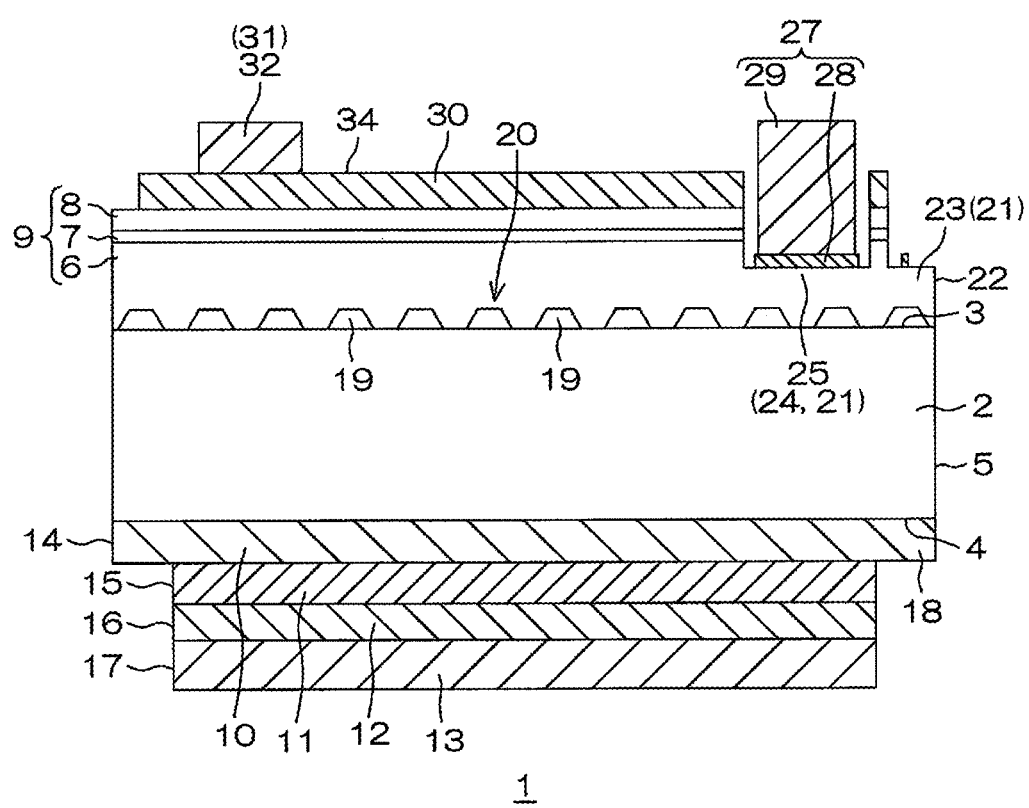
FIG. 3 is a schematic sectional view of the light emitting device of FIG. 1, taken along line A-A in FIG. 1.
Figure 4A:
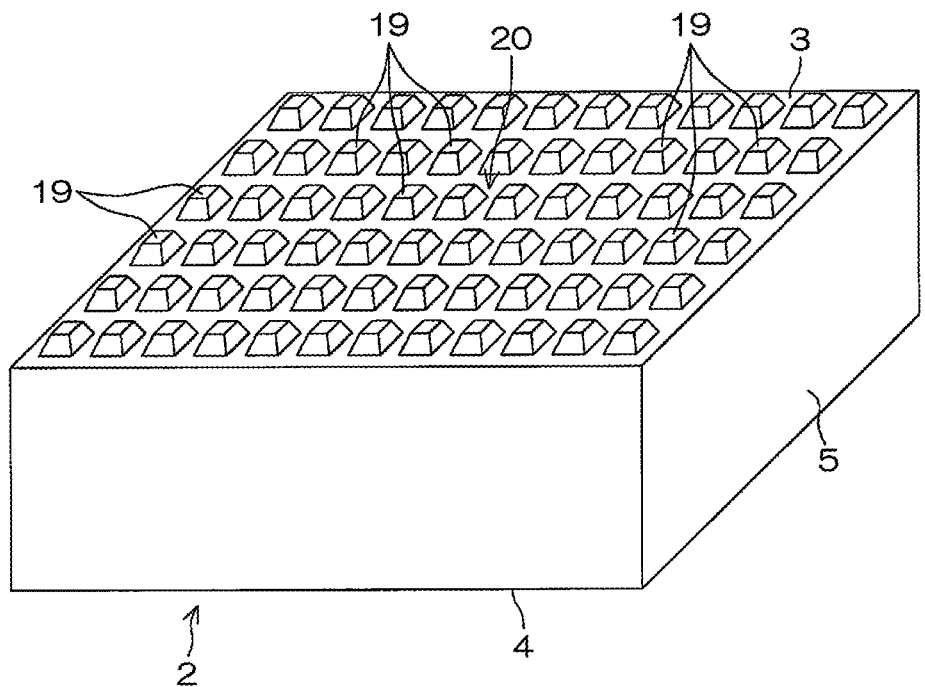
FIG. 4A is a view showing one example of a convex pattern of FIG. 3.
Figure 4B:
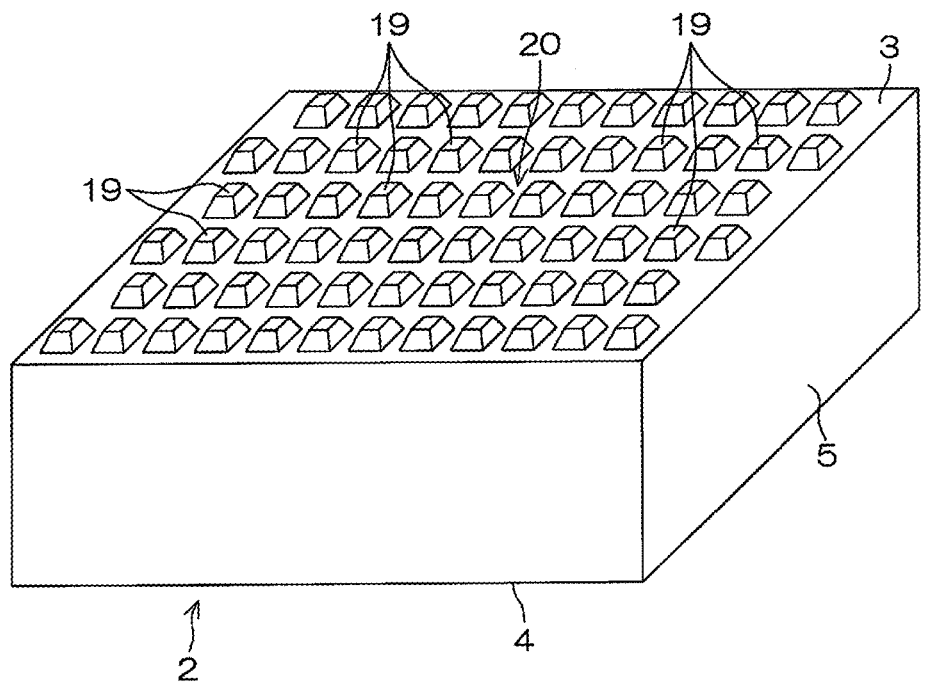
FIG. 4B is a view showing another example of the convex pattern of FIG. 3.

FIG. 1 is a schematic plan view of a light emitting device 1 according to one embodiment of the present disclosure. FIG. 2 is a schematic bottom view of the light emitting device 1 of FIG. 1. FIG. 3 is a schematic sectional view of the light emitting device 1 of FIG. 1, taken along line A-A in FIG. 1. FIG. 4A is a view showing one example of a convex pattern 20 in FIG. 3. FIG. 4B is a view showing another example of the convex pattern 20 in FIG. 3.

The light emitting device 1 has the shape of a rectangular chip when viewed from a plane having long sides and short sides, for example. The chip-shaped light emitting device 1 has, for example, long sides of 0.2 mm to 3.0 mm and short sides of 0.1 mm to 2.0 mm.

The light emitting device 1 includes a substrate 2 having a front surface 3 and a rear surface 4, and a nitride semiconductor stacked structure 9 formed of an n type GaN layer 6 as an n type nitride semiconductor layer, a light emitting layer 7 (for example, InGaN) and a p type GaN layer 8 as a p type nitride semiconductor layer, which are stacked in order on the front surface 3 of the substrate 2. In this embodiment, the front surface 3 of the substrate 2 corresponds to a light extracting surface 34 (which will be described later). When light is emitted from the light emitting layer 7, most of the light transmits through the p type GaN layer 8 and is extracted from a side (the light extracting surface 34 side) of the substrate 2 opposite the light emitting layer 7.

The substrate 2 is made of a material (for example, sapphire, GaN or SiC) transparent to an emission wavelength λ (for example, 450 nm) of the light emitting layer 7. A thickness of the substrate 2 is, for example, 200 µm to 300 µm.

A transparent adhesive layer 10, reflecting metal 11, barrier metal 12 and bonding metal 13 are stacked in order on the rear surface 4 of the substrate 2. The transparent adhesive layer 10 is formed on the entire rear surface 4 of the substrate 2 such that its side 14 (periphery) has the same plane as a side 5 of the substrate 2. The reflecting metal 11, the barrier metal 12 and the bonding metal 13 on the transparent adhesive layer 10 have the same plane in terms of their sides 15, 16 and 17 (peripheries) which partition these metals 11, 12 and 13 in the inside of the side 14 of the transparent adhesive layer 10. Accordingly, as shown in FIG. 2, the reflecting metal 11, the barrier metal 12 and the bonding metal 13 are formed in such a size that they are accommodated in the rear surface 4 of the transparent adhesive layer 10, and, when viewing the light emitting device 1 from the opposite side of the light extracting surface 34 (the rear surface 4 side of the substrate 2), an edge 18 of the transparent adhesive layer 10 (the rear surface of the transparent adhesive layer 10) surrounding the reflecting metal 11, the barrier metal 12 and the bonding metal 13 is exposed. A width of the exposed edge 18 is, for example, 15 µm to 100 µm.

In this embodiment, the transparent adhesive layer 10, the reflecting metal 11, the barrier metal 12 and the bonding metal 13 have a thickness in the order of 20 nm, 100 nm, 100 nm and 2 µm, respectively. However, it is to be noted that these dimensions are merely examples and may be changed where appropriate.

The transparent adhesive layer 10 is made of a material (for example, ITO (Indium Tin Oxide) or ZnO (zinc oxide) transparent to an emission wavelength λ of the light emitting layer 7. A thickness of the transparent adhesive layer 10 may be, for example, 20 nm to 160 nm. In some embodiments, the thickness may be 20 nm to 35 nm since it provides less light absorption without performing heat treatment.

The reflecting metal 11 is made of, for example, an alloy (AgPdCu alloy) including Ag, Pd and Cu, or alternatively, an AgPtCu alloy including Pt replaced for Pd. In some embodiments, a mixing ratio of each metal may be such that Ag is 99%, Pd is 0.6% and Cu is 0.25%. By mixing Pd and Cu with Ag in such a mixing ratio, sulfuration which is apt to occur due to elementary Ag can be prevented.

The barrier metal 12 is formed of, for example, a TiW alloy (an alloy of titanium and tungsten) and the bonding metal 13 is formed of, for example, Ag, solder or an AuSn alloy. Among these combinations, a combination of the barrier metal 12 formed of the TiW alloy and the bonding metal 13 formed of the AuSn alloy may be used in some embodiments. Accordingly, since the barrier metal 12 formed of the TiW alloy is interposed between the reflecting metal 11 (AgPdCu alloy) and the bonding metal 13 (AuSn alloy), an ingredient of the reflecting metal 11 can be prevented from being diffused into the bonding metal 13.

In addition, on the front surface 3 of the substrate 2 is formed a convex pattern 20 formed of a set of convex portions 19 which are discretely arranged at certain distances and project toward the n type GaN layer 6. The arrangement of convex portions 19 in the convex pattern 20 may be, for example, in a matrix form as shown in FIG. 4A or in a zigzag form as shown in FIG. 4B. Each of the convex portions 19 in the convex pattern 20 is made of SiN (silicon nitride).

Since the SiN convex portions 19 are formed on the front surface 3 of the substrate 2, light, which is reflected by the reflecting metal 11 and is incident into an interface between the substrate 2 and the n type GaN layer 6 at different angles, can be prevented from being totally reflected at the interface into the opposite side of the light extracting surface 34 (the reflecting metal 11 side), which can result in improvement in the efficiency of light extraction.

The nitride semiconductor stacked structure 9 is etched from the p type GaN layer 8 up to a depth by which the n type GaN layer 6 is exposed, such that the structure 9 has substantially the same rectangular shape as the light emitting device 1 when viewed from the top. The n type GaN layer 6 has a lead-out portion 21 which is transversally led from the nitride semiconductor stacked structure 9 along the front surface 3 of the substrate 2. That is, the lead-out portion 21 is formed by an extension of the n type GaN layer 6.

The lead-out portion 21 is outwardly led from a side of the nitride semiconductor stacked structure 9 up to a position at which a side 22 of the lead-out portion 21 has the same plane as the side 5 of the substrate 2, and includes a ring-shaped circumference 23 surrounding the nitride semiconductor stacked structure 9 and a rectilinear portion 24 extending in a straight line crossing the nitride semiconductor stacked structure 9 from the circumference 23.

In this embodiment, the circumference 23 of the lead-out portion 21 is formed to have a width as wide as not to oppose the reflecting metal 11 in the thickness direction of the substrate 2. Accordingly, even when a member such as an electrode is formed on the circumference 23, since the member does not oppose the reflecting metal 11 (that is, the member does not obstruct light extraction), extraction efficiency of light reflected by the reflecting metal 11 can be improved.

The rectilinear portion 24 of the lead-out portion 21 includes a pad space 25 (for example, a circular space) which is arranged in an edge of the nitride semiconductor stacked structure 9, and a wiring space 26 which is arranged in a central portion of the nitride semiconductor stacked structure 9 surrounded by the edge and is narrower than the pad space 25.

In this embodiment, the pad space 25 is arranged in one end of the nitride semiconductor stacked structure 9 in a longitudinal direction, and the wiring space 26 extends from the pad space 25 to the opposite side of the pad space 25 in the longitudinal direction.

An n side electrode 27 is formed on a surface of the lead-out portion 21. The n side electrode 27 includes an n side metal wiring 28 disposed on the lead-out portion 21, and an n side pad 29 formed on the n side metal wiring 28 in the pad space 25.

The n side metal wiring 28 is made of, for example, Al or Cr. In this embodiment, the n side metal wiring 28 is configured such that Al is formed to contact the lead-out portion 21 (n type GaN layer 6) and Cr is formed on the Al. The thickness of the n side metal wiring 28 is, for example, 1000 nm or so.

In this embodiment, the n side metal wiring 28 is disposed on the rectilinear portion 24 of the lead-out portion 21 and a portion of the circumference 23 along a short side of the nitride semiconductor stacked structure 9 close to the pad space 25. A contact of the n side electrode 27 for the n type GaN layer 6 is formed by the n side metal wiring 28. In addition, the n side metal wiring 28 is formed to have a plate shape, which is slightly narrower than the pad space 25, in the pad space 25, and have a fine line shape in the rectilinear portion (that is, the wiring space 26) and the circumference 23 other than the pad space 25.

The n side pad 29 is formed to have a column shape (a cylindrical shape in this embodiment) projecting upward from the pad space 25 above the p type GaN layer 8 and its thickness is, for example, 1000 nm or so. The n side pad 29 is made of, for example, Ag, solder or an AuSn alloy.

In regard to the n side electrode 27, although the n side metal wiring 28 crosses the reflecting metal 11 in the longitudinal direction when viewed from the top and opposes the reflecting metal 11 in the thickness direction of the substrate 2, since the n side metal wiring 28 is formed to have a fine line shape, there is little effect on extraction efficiency of light reflected by the reflecting metal 11. On the other hand, although the n side pad 29 is wider than then side metal wiring 28 and also opposes the reflecting metal 11, since then side pad 29 opposes only an edge of the reflecting metal 11, there is little effect on extraction efficiency of light reflected by the reflecting metal 11, like the n side metal wiring 28.

A transparent electrode layer 30 is formed on a surface of the p type GaN layer 8 and a contact of a p side electrode 31 (which will be described below) to the p type GaN layer 8 is formed by the transparent electrode layer 30. The transparent electrode layer 30 is made of, for example, a material transparent to an emission wavelength λ of the light emitting layer 7. The thickness of the transparent electrode layer 30 is, for example, 100 nm or so.

The p side electrode 31 is formed on a front surface 34 of the transparent electrode layer 30. The p side electrode 31 is made of, for example, Ag, solder or an AuSn alloy and includes a p side pad 32 arranged in an edge of the nitride semiconductor stacked structure 9 and a p side metal wiring 33 extending from the p side pad 32 along the side of the nitride semiconductor stacked structure 9. The p side pad 32 and the p side metal wiring 33 are integratedly formed.

In this embodiment, the p side pad 32 is arranged in the opposite side of the n side pad 29 in the longitudinal direction of the nitride semiconductor stacked structure 9, and the p side metal wiring 33 is disposed in parallel to the n side metal wiring 28 on the rectilinear portion 24 and in the outer side of the reflecting metal 11 when viewed from the top. In particular, the p side metal wiring 33 is disposed in one side and the other side of the p side metal wiring 33 one by one with the n side metal wiring 28 on the rectilinear portion 24 interposed therebetween and is integrally connected to the far-side end of the p side pad 32 from the n side pad 29.

In regard to the p side electrode 31, since the p side metal wiring 33 is disposed on the outer side of the reflecting metal 11 to avoid the reflecting metal 11 when viewed from the top, there is little effect on extraction efficiency of light reflected by the reflecting metal 11. On the other hand, although the p side pad 32 opposes the reflecting metal 11, since the p side pad 32 is disposed on the opposite side of the n side pad 29 in the longitudinal direction of the nitride semiconductor stacked structure 9 and opposes only the edge of the reflecting metal 11, there is little effect on extraction efficiency of light reflected by the reflecting metal 11, like the n side pad 29.

In the light emitting device 1, when a forward voltage is applied between the p side electrode 31 (the p side pad 32) and the n side electrode 27 (the n side pad 29), light having an emission wavelength λ (=440 nm to 460 nm) is emitted from the light emitting layer 7. This light transmits through the p type GaN layer 8 and the transparent electrode layer 30 and is extracted from the front surface 34 (light extraction surface) of the transparent electrode layer 30. The light directed from the light emitting layer 7 to the n type GaN layer 6 transmits through the n type GaN layer 6, the substrate 2 and the transparent adhesive layer 10 in order and is reflected by the reflecting metal 11. The reflected light transmits through the substrate 2, the n type GaN layer 6, the light emitting layer 7, the p type GaN layer 8 and the transparent electrode layer 30 in order and is extracted from the light extraction surface 34.

Next, a method for manufacturing the light emitting device 1 will be described by way of two examples.

FIGS. 5A to 5H are views showing sequential steps in a process of manufacturing the light emitting device 1 of FIG. 3.

Figure 5A:
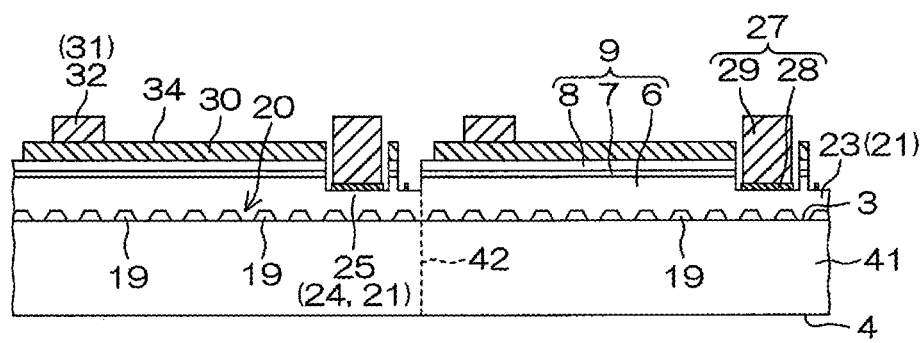
FIG. 5A is a view showing a step in a process of manufacturing the light emitting device of FIG. 3.

For manufacture of the light emitting device 1, for example, as shown in FIG. 5A, a SiN layer is formed on the front surface 3 of a substrate wafer 41 (for example, a 600 μm to 1000 μm-thick wafer) and the convex pattern 20 is formed by separating the SiN layer into the plurality of convex portions 19 by etching using a resist pattern (not shown) as a mask. Next, the nitride semiconductor stacked structure 9 is formed by epitaxially growing the n type GaN layer 6, the light emitting layer 7 and the p type GaN layer 8 to cover the front surface 3 of the substrate wafer 41 with the convex pattern 20. Next, the transparent electrode layer 30 is formed by depositing a material (ITO, etc.) of the transparent electrode layer 30 on the nitride semiconductor stacked structure 9 by, for example, a sputtering process.

Next, the transparent electrode layer 30 and the nitride semiconductor stacked structure 9 are etched using a mask such that the nitride semiconductor stacked structure 9 is shaped into a predetermined form (a rectangular form when viewed from top) and the lead-out portion 21 corresponding to the extension of the n type GaN layer 6 is formed.

Next, the p side electrode 31 is formed on the transparent electrode layer 30 and the n side electrode 27 is formed on the lead-out portion 21 (the n type GaN layer 6).

Thereafter, with the front surface 3 of the substrate wafer 41 being protected, the substrate wafer 41 is grinded until it reaches a thickness of 200 μm to 300 μm, starting from the rear surface 4 thereof.

Figure 5B:
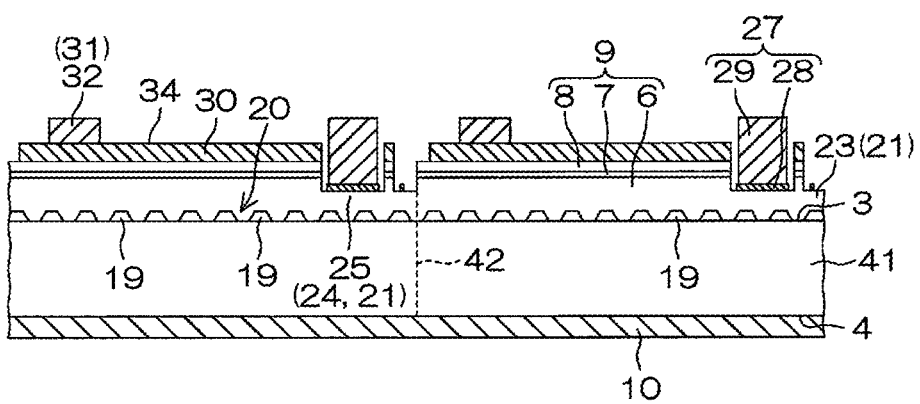
FIG. 5B is a schematic sectional view showing a step subsequent to FIG. 5A.

Next, as shown in FIG. 5B, the transparent adhesive layer 10 covering the entire rear surface 4 of the substrate wafer 41 is formed by depositing a material (ITO, etc.) of the transparent adhesive layer 10 on the entire rear surface 4 by, for example, a sputtering process.

Figure 5C:
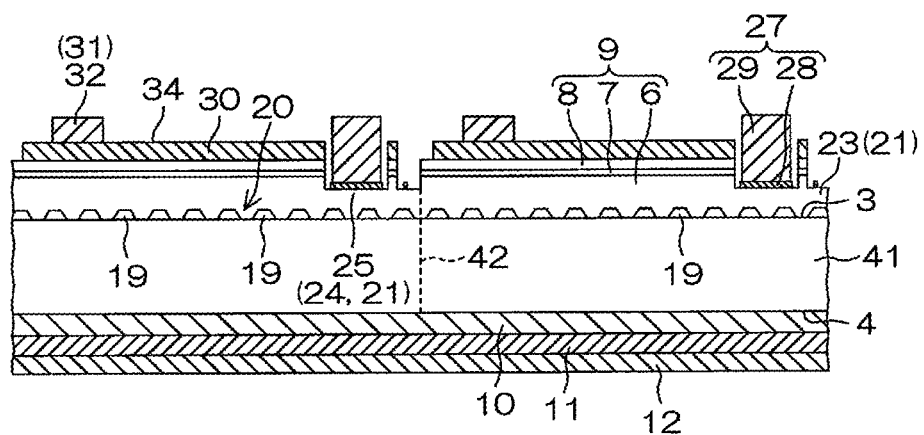
FIG. 5C is a schematic sectional view showing a step subsequent to FIG. 5B.

Next, as shown in FIG. 5C, after depositing a material (an AgPdCu alloy, etc.) of the reflecting metal 11 on the transparent adhesive layer 10 by, for example, a sputtering process, a material (a TiW alloy, etc.) of the barrier metal 12 is deposited on the entire rear surface of the reflecting metal 11.

Figure 5D:
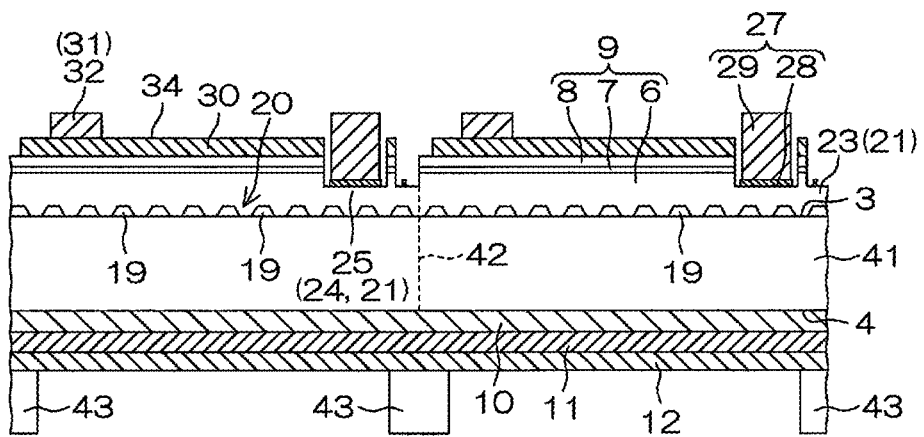
FIG. 5D is a schematic sectional view showing a step subsequent to FIG. 5C.

Next, as shown in FIG. 5D, a resist pattern 43 is formed to cover a region having a predetermined width on a planned cutting line 42 of the substrate wafer 41 in the barrier metal 12 and a material (an AuSn alloy, etc.) of the bonding metal 13 is deposited through the resist pattern 43. Then, an unnecessary portion of the material of the bonding metal 13 (a portion deposited on the resist pattern 43) is lifted off along with the resist pattern 43.

Figure 5E:
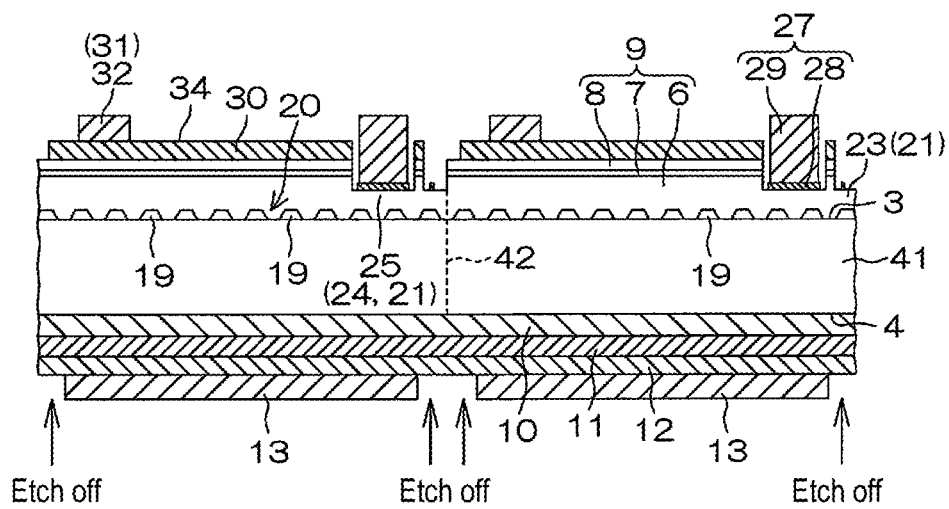
FIG. 5E is a schematic sectional view showing a step subsequent to FIG. 5D.
Figure 5F:
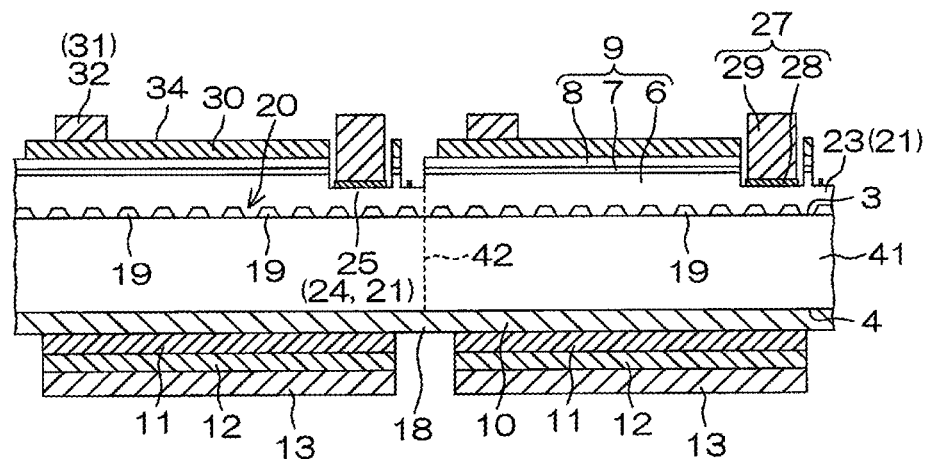
FIG. 5F is a schematic sectional view showing a step subsequent to FIG. 5E.

Accordingly, as shown in FIG. 5E, the bonding metal 13 is formed to selectively expose a portion of the barrier metal 12 and the reflecting metal 11 along the planned cutting line 42. Next, the barrier metal 12 and the reflecting metal 11 exposed from the bonding metal 13 is removed (etched off)

by, for example, a dry etching. Accordingly, as shown in FIG. 5F, an edge 18 of the transparent adhesive layer 10 is selectively exposed along the planned cutting line 42. An exposure width may be equal to or more than 30 µm (equal to or more than 15 µm in one exposed portion) because a laser scanning is to be performed in the subsequent step.

Figure 5G:
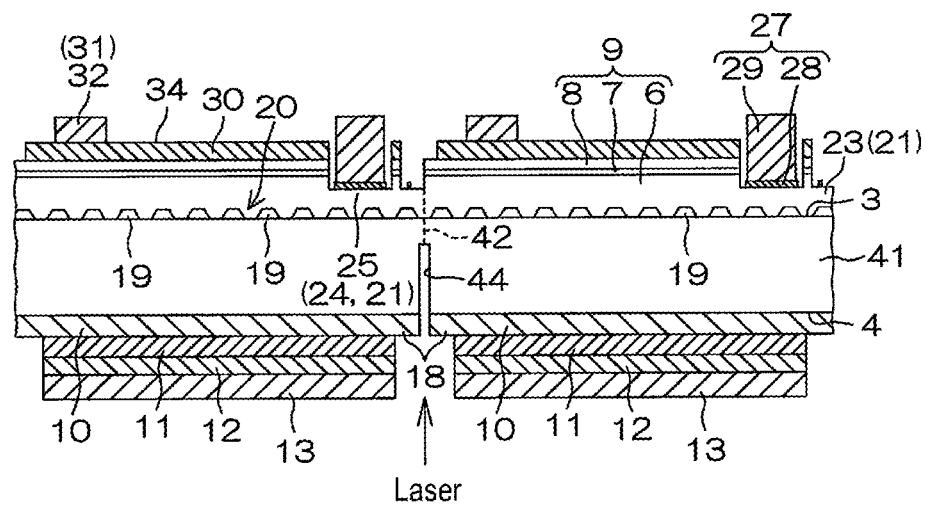
FIG. 5G is a schematic sectional view showing a step subsequent to FIG. 5F.

Next, as shown in FIG. 5G, a laser machine is used to scan the substrate wafer 41 with laser light from the rear surface 4 of the substrate wafer 41. More specifically, the substrate wafer 41 is scanned with the laser light along the planned cutting line 42 to form a division guide groove 44. In the course of scanning, the substrate wafer 41 may be scanned either always or intermittently by turning on/off a laser light generation unit.

At a position where the substrate wafer 41 is scanned with the laser light, the laser light is concentrated on the bottom of the division guide groove 44 and multiphoton absorption occurs at a light concentration point thereof. Then, the light concentration point is scanned along the bottom of the division guide groove 44 to form the division guide groove 44 along the planned cutting line 42. The depth of the division guide groove 44 is, for example, 100 µm or so. In this case, the division guide groove 44 reaches the middle of the substrate wafer 41 through the transparent adhesive layer 10.

Figure 5H:
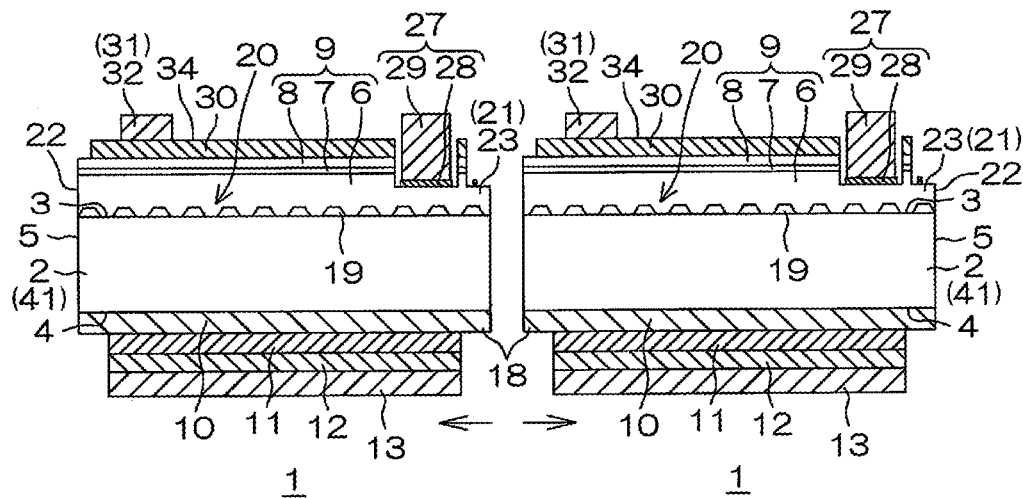
FIG. 5H is a schematic sectional view showing a step subsequent to FIG. 5G.

Thus, after the division guide groove 44 is formed, as shown in FIG. 5H, an external force is applied to the substrate wafer 41 to divide the substrate wafer 41 into segments (chips) of the light emitting device 1. Accordingly, segments of the light emitting device 1 of FIG. 3 can be obtained.

FIGS. 6A to 6H are views showing sequential steps in another process of manufacturing the light emitting device 1 of FIG. 3. The light emitting device 1 may be manufactured according to the following manufacturing process.

Figure 6A:
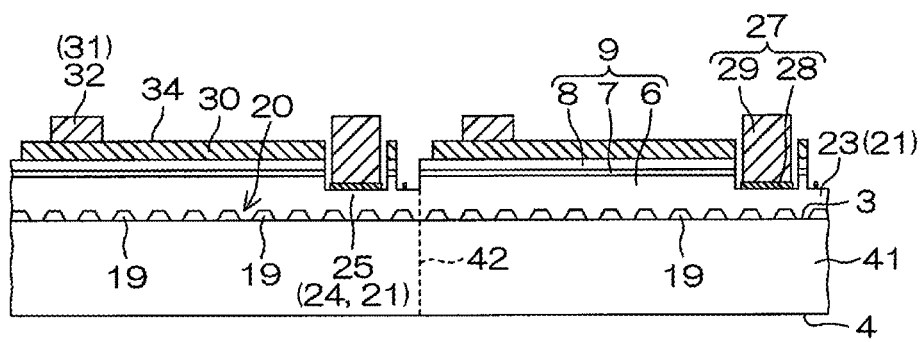
FIG. 6A is a view showing a step in another process of manufacturing the light emitting device of FIG. 3.

In this case, for example, as shown in FIG. 6A, like FIG. 5A, after the convex pattern 20 is formed on the front surface 3 of the substrate wafer 41, the nitride semiconductor stacked structure 9 and the transparent electrode layer 30 are formed and, subsequently, the p side electrode 31 and the n side electrode 27 are formed. Thereafter, with the front surface 3 of the substrate wafer 41 being protected, the substrate wafer 41 is grinded until it reaches a thickness of 200 µm to 300 µm, starting from the rear surface 4 thereof.

Figure 6B:
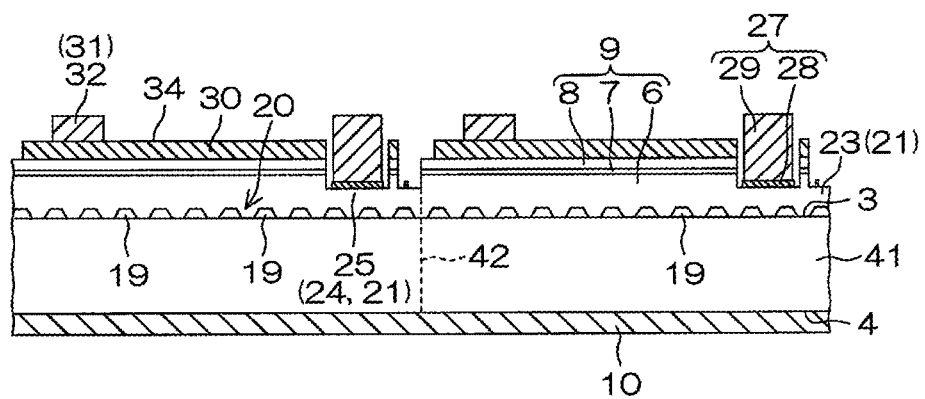
FIG. 6B is a schematic sectional view showing a step subsequent to FIG. 6A.

Next, as shown in FIG. 6B, the transparent adhesive layer 10 covering the entire rear surface 4 of the substrate wafer 41 is formed by depositing a material (ITO, etc.) of the transparent adhesive layer 10 on the entire rear surface 4 by, for example, a sputtering process.

Figure 6C:
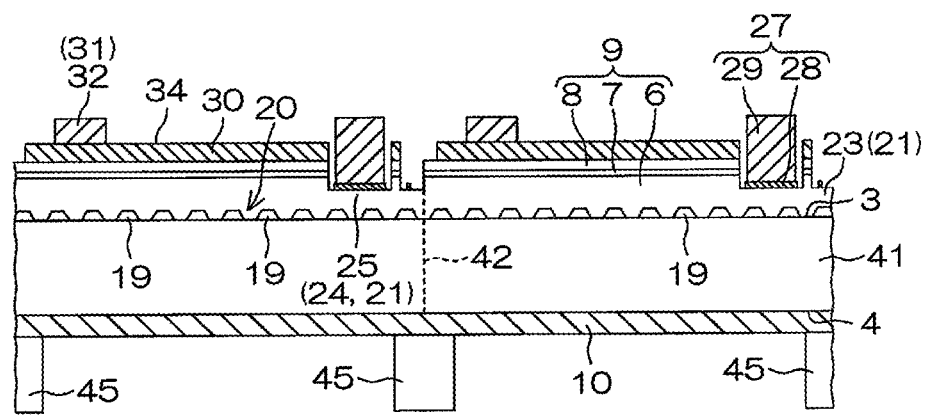
FIG. 6C is a schematic sectional view showing a step subsequent to FIG. 6B.

Next, as shown in FIG. 6C, a resist pattern 45 is formed to cover a region having a predetermined width on a planned cutting line 42 of the substrate wafer 41 in the transparent adhesive layer 10.

Figure 6D:
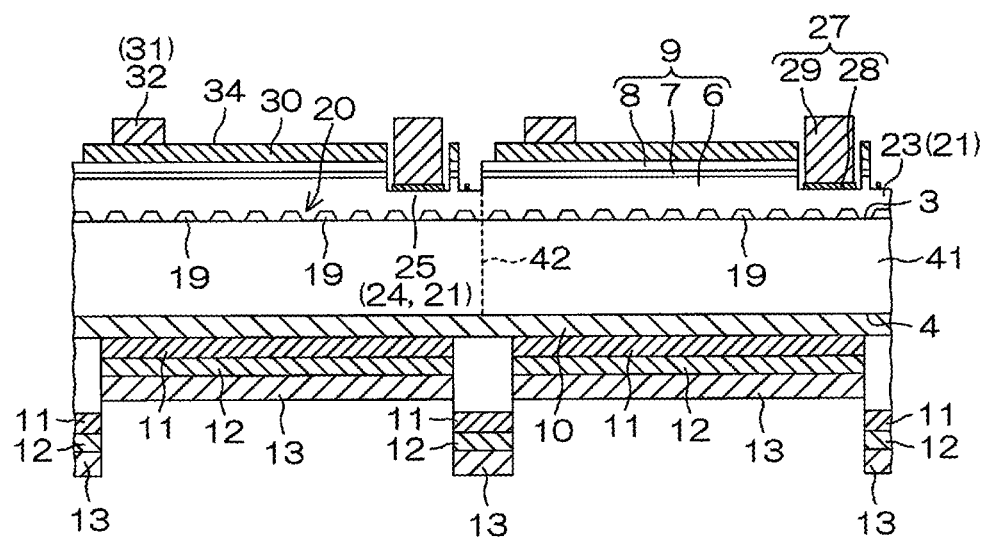
FIG. 6D is a schematic sectional view showing a step subsequent to FIG. 6C.

Next, as shown in FIG. 6D, a material (an Ag PdCu alloy, etc.) of the reflecting metal 11, a material (a TiW alloy, etc.) of the barrier metal 12, and a material (an AuSn alloy, etc.) of the bonding metal 13 are deposited in order through the resist pattern 45 by, for example, a sputtering process.

Figure 6E:
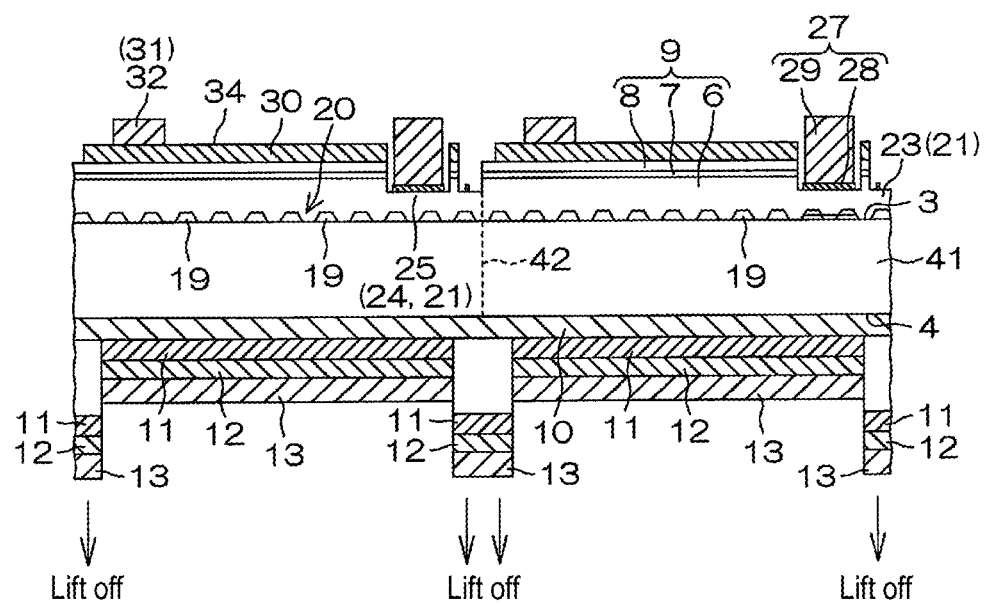
FIG. 6E is a schematic sectional view showing a step subsequent to FIG. 6D.

Next, as shown in FIG. 6E, an unnecessary portion of the materials of the reflecting metal 11, the barrier metal 12 and the bonding metal 13 (a portion deposited on the resist pattern 45) is lifted off along with the resist pattern 45.

Figure 6F:
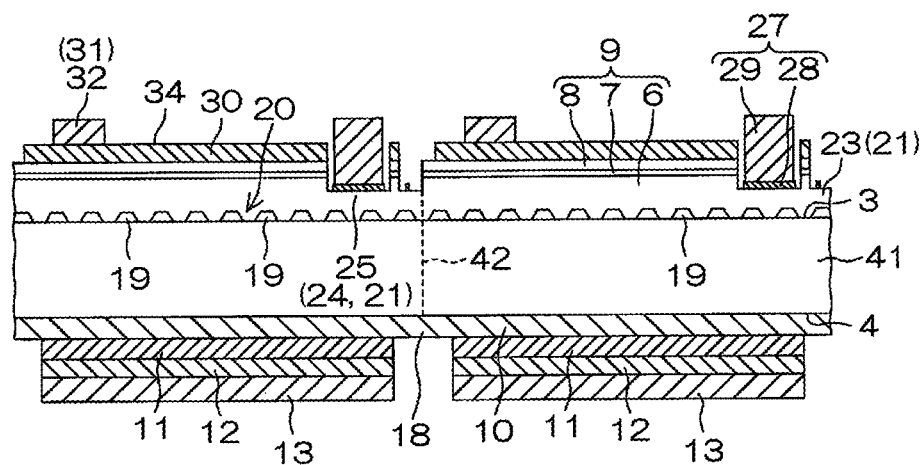
FIG. 6F is a schematic sectional view showing a step subsequent to FIG. 6E.

Accordingly, as shown in FIG. 6F, an edge 18 of the transparent adhesive layer 10 is selectively exposed along the planned cutting line 42.

Figure 6G:
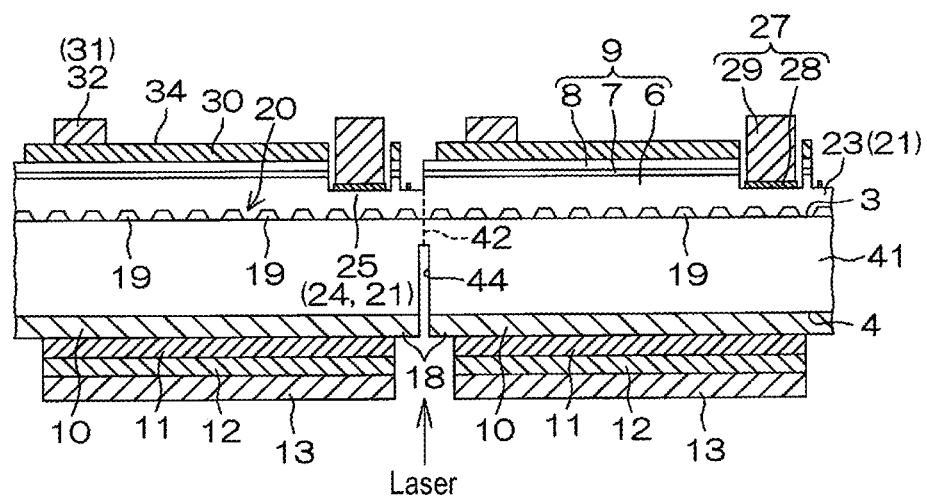
FIG. 6G is a schematic sectional view showing a step subsequent to FIG. 6F.
Figure 6H:
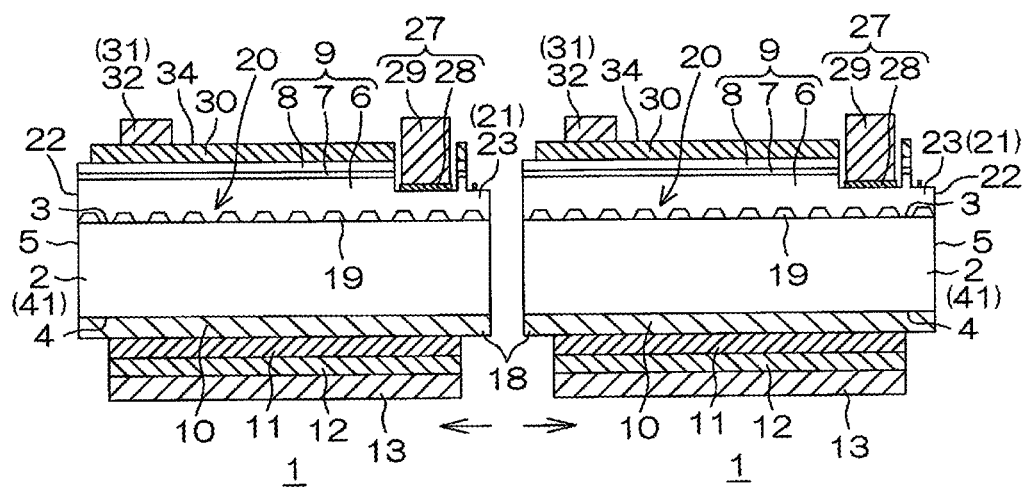
FIG. 6H is a schematic sectional view showing a step subsequent to FIG. 6G.

Thereafter, as shown in FIGS. 6G and 6H, like FIGS. 5G and 5H, a laser machine is used to form a division guide groove 44 (FIG. 6G), and an external force is applied to the substrate wafer 41 to divide the substrate wafer 41 into segments (chips) of the light emitting device 1 (FIG. 6H). Accordingly, segments of the light emitting device 1 of FIG. 3 can be obtained.

FIG. 7 is a schematic sectional view of a light emitting device package 51.

The light emitting device package 51 includes a light emitting device 1, a support board 52 and a resin package 53.

The light emitting device 1 is disposed on the support board 52 by bonding the bonding metal 13 to the support board 52 in a face-up posture in which the front surface 3 of the substrate 2 is directed upward.

The support board 52 includes an insulating substrate 54 supporting the light emitting device 1, and a pair of metal electrodes (an external n side electrode 55 and an external p side electrode 56) which is disposed to be exposed at both ends of the insulating substrate 54 and electrically connected to the light emitting device 1.

To be specific, the n side electrode 27 (the n side pad 29) of the light emitting device 1 is connected to the external n side electrode 55 via an n side wire 57, and the p side electrode 31 (the p side pad 32) of the light emitting device 1 is connected to the external p side electrode 56 via a p side wire 58.

The resin package 53 is a case filled with resin and is fixed to the support board 52 with the light emitting device 1 received (covered) therein. The resin package 53 has a reflecting portion 59 in its lateral side (a portion facing the light emitting device 1) and reflects light emitted from the light emitting device 1 to extract the reflected light to the outside.

The resin forming the resin package 53 may contain a fluorescent material or a reflecting agent. For example, if the light emitting device 1 emits blue light, the light emitting device package 51 can emit white light by containing a yellow fluorescent material in the resin. A collection of a plurality of light emitting device packages 51 may be used for illumination devices such as light bulbs and the like, backlights of liquid crystal televisions, head lamps of vehicles, and the like.

As described above, with the above-configured light emitting device 1, when the light emitting layer 7 emits light, most of the light transmits through the p type GaN layer 8 and is extracted from the front surface 34 of the transparent electrode layer 30 (the light extraction surface), whereas some of the light transmits through the n type GaN layer 6, the substrate 2 and the transparent adhesive layer 10 in order, is reflected at the interface between the transparent adhesive layer 10 and the reflecting metal 11, and then is extracted from the light extraction surface 34.

The light can be well reflected with a reflectivity of equal to or more than 90% at the interface between the reflecting metal 11, which is formed of an alloy containing Ag, a Pt group metal and Cu, and the transparent adhesive layer 10. As a result, the extraction efficiency of light from the light emitting device 1 can be improved, which can result in a highly luminescent light emitting device 1.

In addition, adhesion between the reflecting metal 11 and the substrate 2 can be improved by adhering the reflecting metal 11 and the substrate 2 together with the transparent adhesive layer 10 interposed therebetween instead of directly adhering the reflecting metal 11 and the substrate 2.

For the purpose of demonstration of these effects, four light emitting devices 1 having the same conditions except a material of the reflecting metal 11 and the presence or not of the transparent adhesive layer 10 were manufactured and their respective reflectivity, adhesion and sulfuration were examined. Results of the examination are as listed in the following Table 1.

TABLE 1

|  | Experimental Example 1 | Experimental Example 2 | Experimental Example 3 | Experimental Example 4 |
|---|---|---|---|---|
| Reflecting metal | Al | Ag | AgPdCu | AgPdCu |
| Presence or not of adhesive layer | X | X | X | ○ (ITO) |
| Reflectivity | Δ (87%) | ⊚ (97%) | ○ (93%) | ○ (92%) |
| Adhesion | ○ | X | Δ | ○ |
| Presence or not of sulfuration | ○ (Not present) | X (present) | ○ (Not present) | ○ (Not present) |

As shown in Table 1, Experimental Examples 3 and 4 using a reflecting metal formed of an AgPdCu alloy can realize a high reflectivity of equal to or more than 90%. Further, a light emitting device of Experimental Example 4 having a transparent adhesive layer formed of ITO had good adhesiveness.

In contrast, Experimental Example 1 using a reflecting metal formed of Al shows a somewhat low reflectivity of 87%, and Experimental Example 2 using a reflecting metal formed of Ag shows low adhesiveness and results in a sulfurated reflecting metal although showing a high reflectivity of 97%.

According to the manufacturing process of this embodiment, as shown in FIGS. 5F and 6F, the reflecting metal 11, the barrier metal 12 and the bonding metal 13 are formed such that the edge 18 of the transparent adhesive layer 10 is selectively exposed along the planned cutting line 42, and metal such as the reflecting metal 11 and so on is not present on the planned cutting line 42.

Accordingly, since the substrate wafer 41 can be easily irradiated with laser light when the division guide groove 44 is formed along the planned cutting line 42, the division guide groove 44 can be simply formed along the planned cutting line 42 in the transparent adhesive layer 10 and the substrate wafer 41. In addition, since the transparent adhesive layer 10 is disposed on the planned cutting line 42 of the substrate wafer 41, highly precise alignment (positioning) can be provided when the division guide groove 44 is formed.

In addition, since the division guide groove 44 is formed by laser irradiation from the rear surface 4 of the substrate wafer 41, there is no direct damage of the n type GaN layer 6, the light emitting layer 7 and the p type GaN layer 8 stacked on the front surface 3 of the substrate wafer 41, which can result in a high quality light emitting device 1.

In addition, in the steps shown in FIGS. 5A to 5H, since the reflecting metal 11 is first formed on the entire rear surface of the transparent adhesive layer 10 (FIG. 5C), there is no need to form a mask such as a resist pattern or the like on the rear surface of the transparent adhesive layer 10 when the reflecting metal 11 is adhered to the rear surface of the transparent adhesive layer 10. Accordingly, when the reflecting metal 11 is deposited on the transparent adhesive layer 10, alien substances such as fragments of the mask can be prevented from being introduced into the interface between the transparent adhesive layer 10 and the reflecting metal 11, which can result in high adhesiveness of the reflecting metal 11 to the transparent adhesive layer 10.

On the other hand, in the steps shown in FIGS. 6A to 6H, the reflecting metal 11, the barrier metal 12 and the bonding metal 13 are deposited in order after forming the resist pattern 45 on the rear surface of the transparent adhesive layer 10 (FIGS. 6C and 6D). Accordingly, unlike the steps of FIGS. 5A to 5H, alien substances such as fragments of the resist pattern 45 may be introduced into the interfaces between the reflecting metal 11 and the barrier metal 12 and between the barrier metal 12 and the bonding metal 13 when the reflecting metal 11, the barrier metal 12 and the bonding metal 13 are deposited. However, by depositing the reflecting metal 11, the barrier metal 12 and the bonding metal 13 on the pre-formed resist pattern 45 and then lifting off unnecessary portions of these metals 11, 12 and 13 (FIG. 6E), the finally-shaped reflecting metal 11, the barrier metal 12 and the bonding metal 13 can be formed at once (FIG. 6F), which can result in simplified manufacture process.

Although the example embodiments of the present disclosure have been described, the present disclosure may be practiced in other different ways.

Figure 8:
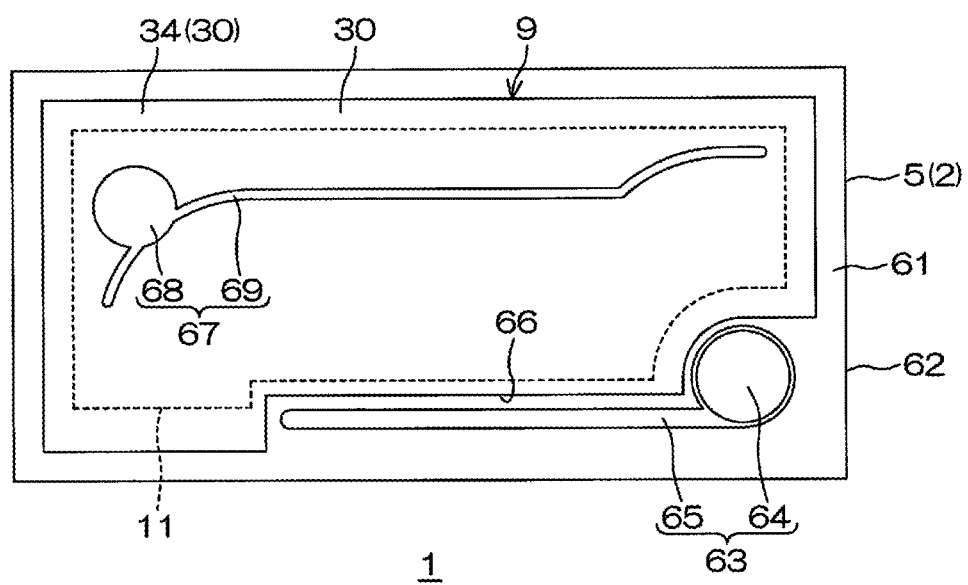
FIG. 8 is a view showing a modification of a layout of a p side electrode and an n side electrode.
Figure 9:
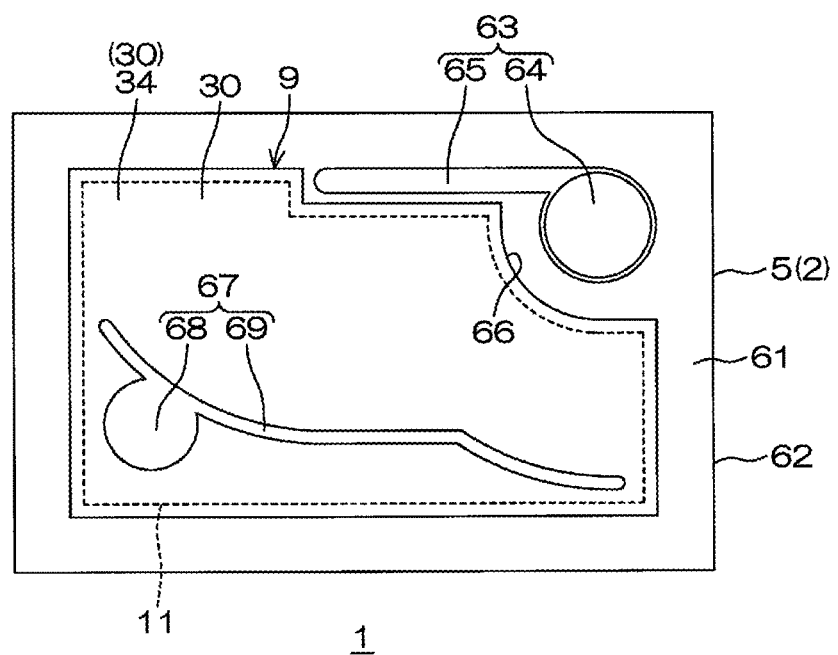
FIG. 9 is a view showing another modification of the layout of the p side electrode and the n side electrode.

For example, the n side electrode 27 and the p side electrode 31 may have a layout shown in FIG. 8 or 9.

For example, in FIGS. 8 and 9, a lead-out portion 61 formed by an extension of the n type GaN layer 6 is formed to have a ring shape in which a side 62 of the lead-out portion 61 is led outwardly from the side of the nitride semiconductor stacked structure 9 up to a position where the side 62 of the lead-out portion 61 has the same plane as the side 5 of the substrate 2.

The n side electrode 63 includes an n side pad 64 which is arranged in one corner of the lead-out portion 61, and an n side metal wiring 65 which supports the n side pad 64 and extends from the position of the n side pad 64 along the side 5 of the substrate 2. In this modification, the n side metal wiring 65 extends in the longitudinal direction of the substrate 2.

In addition, the nitride semiconductor stacked structure 9 is formed to have a rectangular shape which is substantially the same shape as the light emitting device 1 in entirety when viewed from the top, and has a concave surface 66 which is inward dented along a shape of the n side electrode 63 in a region where the n side electrode 63 is disposed.

In addition, a p side electrode 67 includes a p side pad 68 which is arranged in a position diagonal to the n side pad 64, and a p side metal wiring 69 which extends from the p side pad 68 in the longitudinal direction of the substrate 2. The p side electrode 67 and the p side pad 68 are integrally formed.

Figure 10:
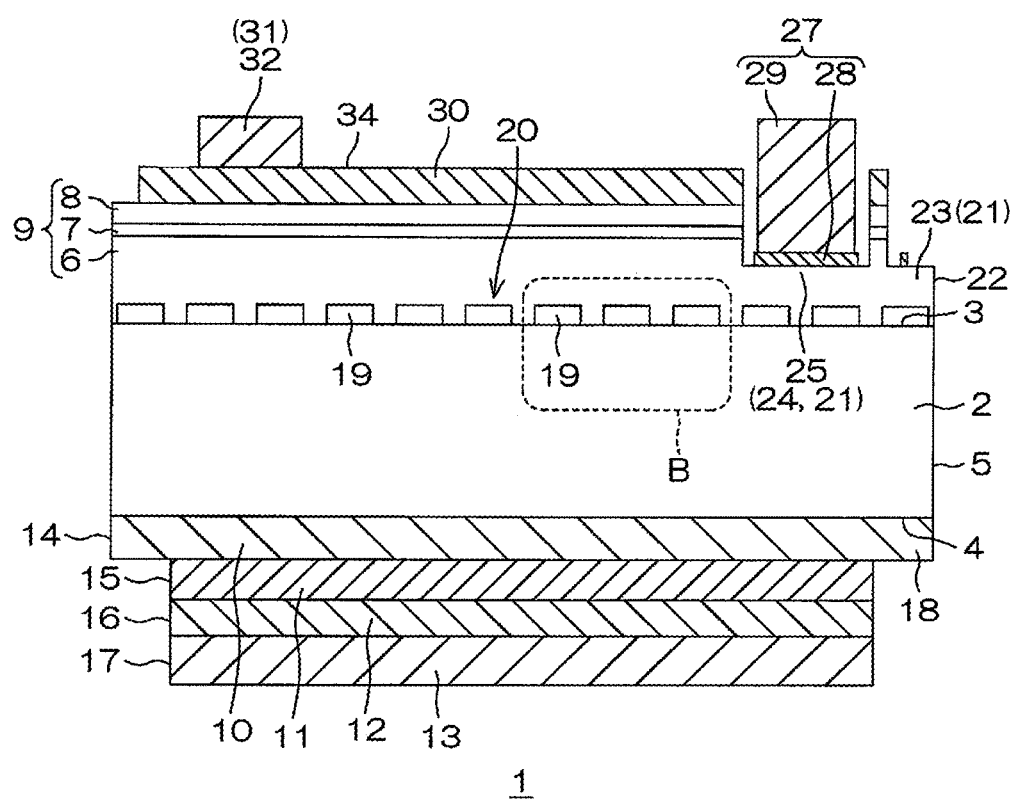
FIG. 10 is a schematic sectional view of a light emitting device according to another embodiment of the present disclosure, taken along line A-A in FIG. 1.
Figure 11A:
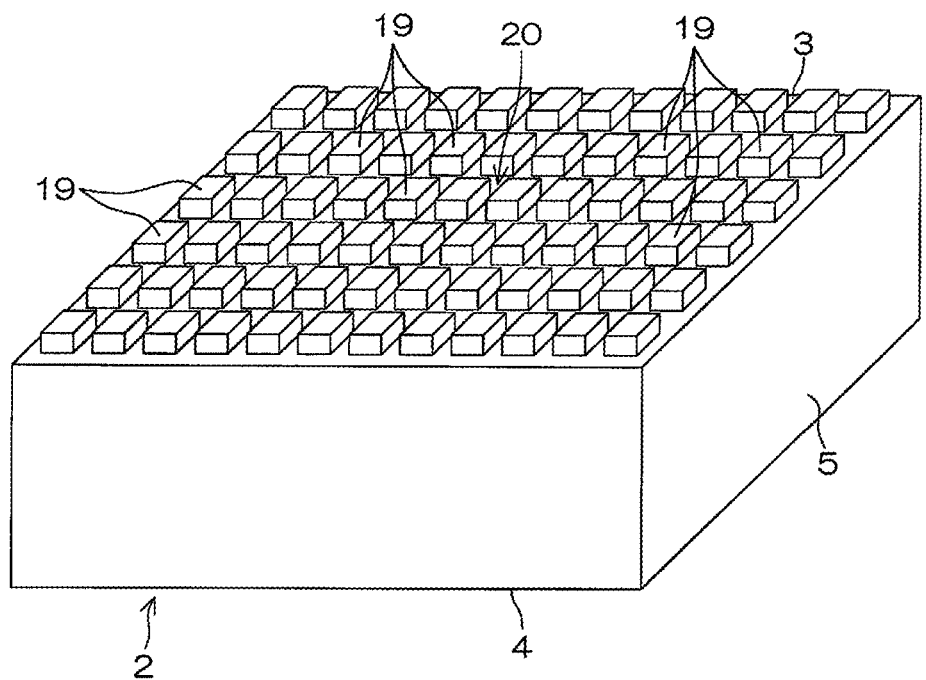
FIG. 11A is a view showing one example of a convex pattern of FIG. 10.
Figure 11B:
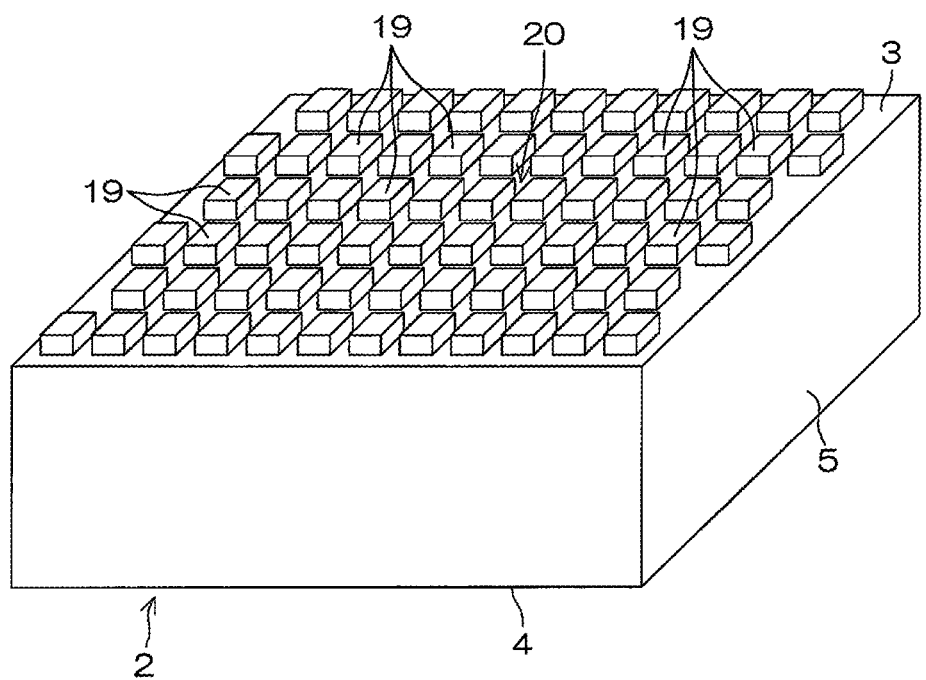
FIG. 11B is a view showing another example of the convex pattern of FIG. 10.

FIG. 10 is a schematic sectional view of a light emitting device according to another embodiment of the present disclosure. FIG. 11A is a view showing an example of a convex pattern of FIG. 10. FIG. 11B is a view showing another example of the convex pattern of FIG. 10. FIG. 10 has substantially the same configuration as FIG. 3 except for the shape of convex portions 19.

Next, the shape of the convex portions 19 in the convex pattern 20 will be described with reference to a zigzag pattern of FIG. 11B as an example.

Figure 12:
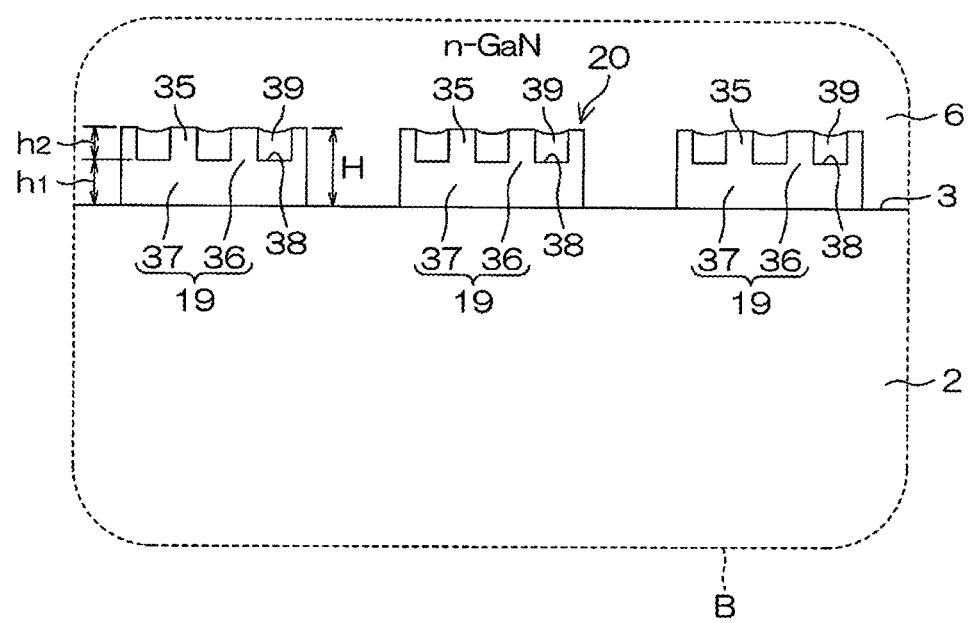
FIG. 12 is an enlarged view of the convex pattern of FIG. 10, showing a region surrounded by a dashed line of FIG. 10.
Figure 13:
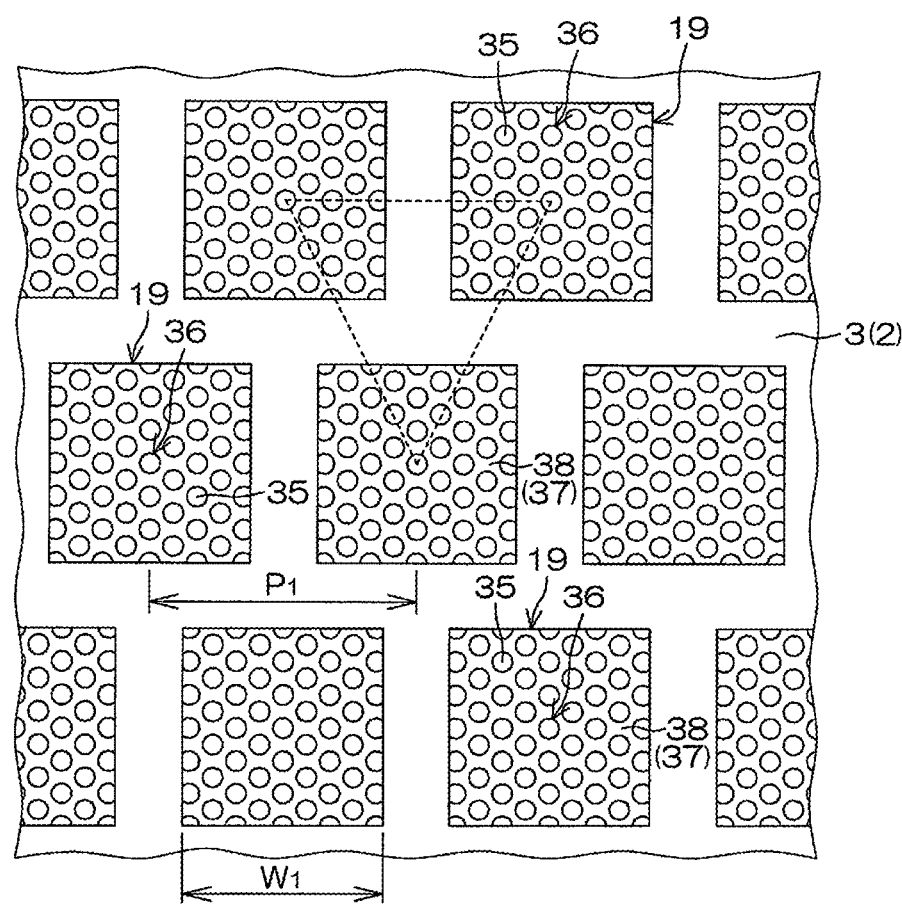
FIG. 13 is a schematic plan view of the convex pattern.
Figure 14:
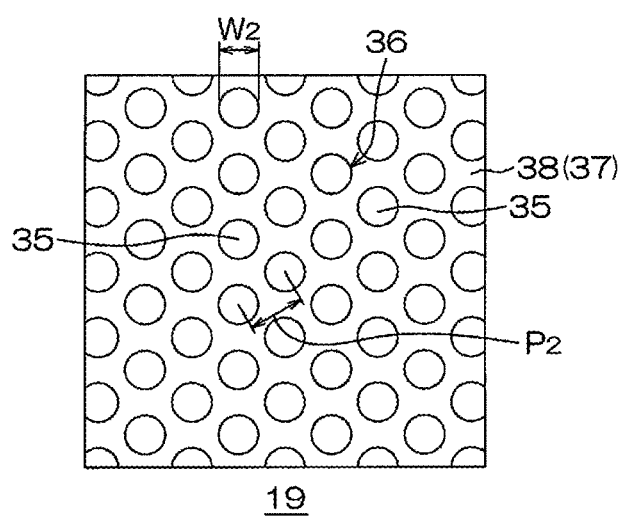
FIG. 14 is a plan view of one convex portion in the convex pattern.

FIG. 12 is an enlarged view of the convex pattern of FIG. 10, showing a region surrounded by a dashed line of FIG. 10. FIG. 13 is a schematic plan view of the convex pattern. FIG. 14 is a plan view of one convex portion in the convex pattern.

First, the convex portions 19 are arranged with a first pitch ($p_1$) (for example, 4.5 μm to 5.5 μm) in a zigzag pattern on the front surface 3 of the substrate 2, and, for example, occupancy of the convex pattern 20 in a certain region of the front surface 3 of the substrate 2 is 50% to 55%. In this embodiment, the occupancy of the convex pattern 20 represents a percentage of planar area of the convex pattern 20 which is accommodated within a basic triangular lattice (see the dashed line in FIG. 13) formed by interconnecting centers of three adjacent convex portions 19.

Each convex portion 19 includes a sub convex pattern 36 consisting of a plurality of fine convex portions 35 discretely formed at the top of the convex portion 19 with a second pitch ($p_2$) (for example, 600 nm to 800 nm) which is smaller than the first pitch ($p_1$), and a base 37 which supports the sub convex pattern 36.

The base 37 has a rectangular parallelepiped shape and its height ($h_1$) (height measured with respect to the front surface 3 of the substrate 2) is, for example, 1.0 μm to 1.5 μm. In addition, the base 37 has a width (w1) on the order of microns. As used herein, a micron order represents the unit "μm" by which the width ($w_1$) is expressed, for example, a range from several μm to 1000 μm. In more detail, the width ($w_1$) of the base 37 is 2.0 μm to 5.0 μm.

The fine convex portions 35 are discretely arranged on a front surface 38 (that is, the top) of the base 37 in a manner to project upward from the front surface 38. The arrangement of fine convex portions 35 may be, for example, in a zigzag pattern in this embodiment, or alternatively in a matrix form.

Each fine convex portion 35 has a cylindrical shape and its height ($h_2$) (height measured with respect to the front surface 38 of the base 37) is, for example, 0.5 nm to 1.0 nm. Further, a height (H) of the convex portion 19 (height measured with respect to the front surface 3 of the substrate 2), which is an addition of the height ($h_1$) of the base 37 and the height ($h_2$) of the fine convex portion 35, is, for example, 1.0 μm to 2.0 μm.

In addition, each fine convex portion 35 has width ($w_2$) (diameter) on the nano order. As used herein, the nano order represents the unit "nm" by which the width ($w_2$) is expressed, for example, as a range from several nm to 1000 nm. In more detail, the width ($w_2$) of the fine convex portion 35 is 400 nm to 600 nm.

The n type GaN layer 6 covering the convex pattern 20 fills spaces between the convex portions 39 in such a manner that the n type GaN layer 6 does not fill the spaces between adjacent fine convex portions 35 while filling the spaces between adjacent convex portions 19. Accordingly, each convex portion 19 has spaces 39 (having a refractive index $n_{Air}$ of approximately 1) defined by the fine convex portions 35 and the n type GaN layer 6 spanning between tops of the fine convex portions 35.

FIGS. 15A to 15K are views showing sequential steps in a process of manufacturing the light emitting device 1 of FIG. 10.

Figure 15A:
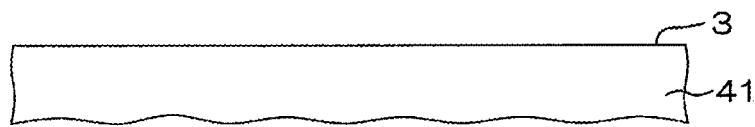
FIG. 15A is a view showing a step in a process of manufacturing the light emitting device of FIG. 10.

For manufacture of the light emitting device 1, for example, a substrate wafer 41 (for example, a 350 μm to 900 μm-thick wafer) is prepared, as shown in FIG. 15A.

Figure 15B:
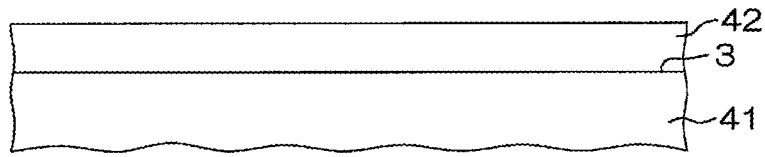
FIG. 15B is a schematic sectional view showing a step subsequent to FIG. 15A.

Next, as shown in FIG. 15B, a SiN processing film 42, which will be processed to be a convex pattern 20, is formed on the entire front surface 3 of the substrate wafer 41. The processing film 42 may be made of, for example, $SiO_2$, SiON, $Al_2O_3$ or the like.

Figure 15C:
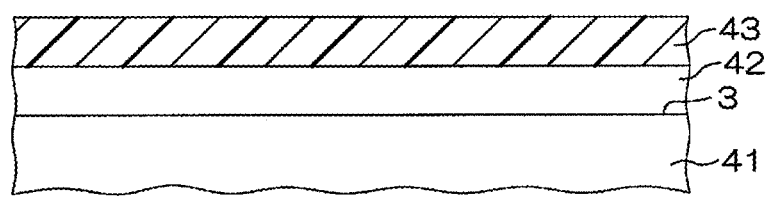
FIG. 15C is a schematic sectional view showing a step subsequent to FIG. 15B.

Next, as shown in FIG. 15C, a resist 43 is formed on the processing film 42.

Figure 15D:
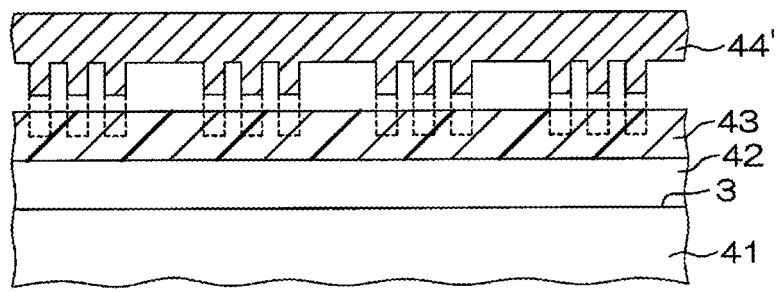
FIG. 15D is a schematic sectional view showing a step subsequent to FIG. 15C.

Next, as shown in FIG. 15D, a nano imprint mold 44 for use in applying a nano imprint technique is prepared. An example of a material of the nano imprint mold 44 may include metal such as Cu, quartz or the like. A pattern of the nano imprint mold 44 is formed using electron beam lithography and has a nano metal scale.

Figure 15E:
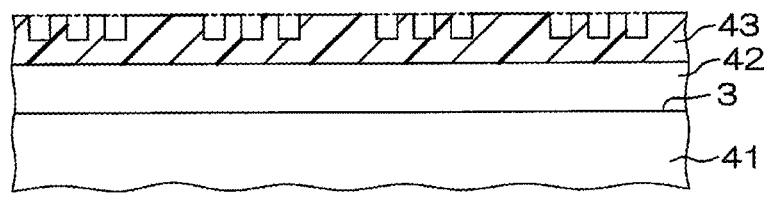
FIG. 15E is a schematic sectional view showing a step subsequent to FIG. 15D.

Next, as shown in FIG. 15E, the nano imprint technique is applied to press the nano imprint mold 44 to the resist 43, thereby forming concave portions in the resist 43. Here, examples of the nano imprint technique may include a thermal cycle nano imprint technique, an optical nano imprint technique and the like.

Figure 15F:
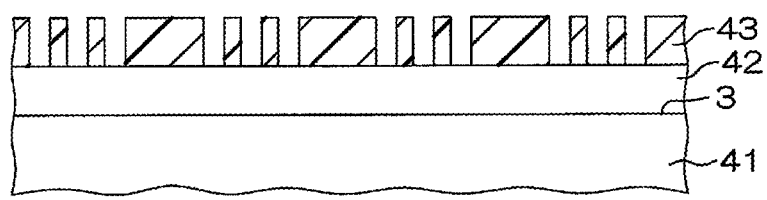
FIG. 15F is a schematic sectional view showing a step subsequent to FIG. 15E.
Figure 15G:
FIG. 15G is a schematic sectional view showing a step subsequent to FIG. 15F.

Next, as shown in FIG. 15F, the resist 43 is processed to expose the processing film 42 by an etching process such as RIE (Reactive Ion Etching) or the like. Next, as shown in FIG. 15G, the processing film 42 is removed up to the middle of the film in the film thickness direction by an etching process such as RIE or the like using the processed resist 43 as a mask, thereby forming a sub convex pattern 36.

Figure 15H:
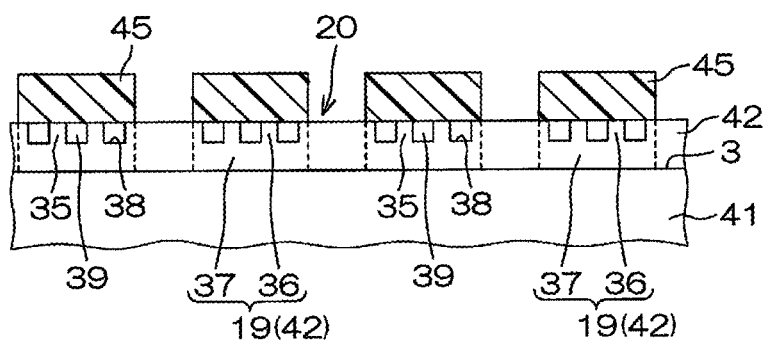
FIG. 15H is a schematic sectional view showing a step subsequent to FIG. 15G.

Next, as shown in FIG. 15H, a resist 45 is formed, and then, by an etching using the formed resist 45 as a mask, the processing film 42 is separated into a plurality of convex portions 19 and a base 37 for each convex portion 19 is shaped, thereby forming the convex patterns 20. Accordingly, the front surface 3 of the substrate 2 is exposed from between the convex patterns 20.

Figure 15I:
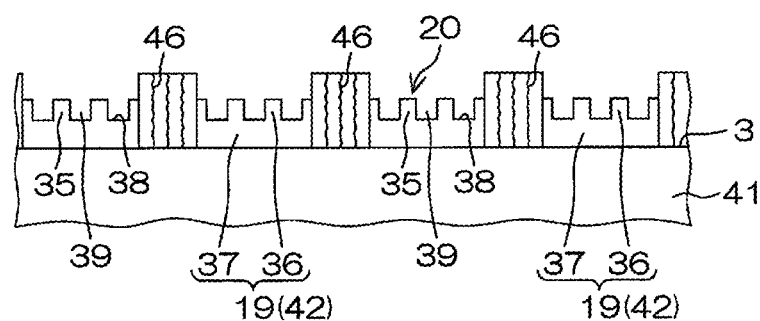
FIG. 15I is a schematic sectional view showing a step subsequent to FIG. 15H.

Next, as shown in FIG. 15I, a GaN layer, which will become the n type GaN layer 6, is grown on the exposed substrate 2 using, for example, MOCVD (Metal Organic Chemical Vapor Deposition) or the like. For example, after the substrate 2 is thermally cleaned, the temperature of the substrate 2 is set to 1000 degrees C. or so and the n type GaN layer 6 doped with n type impurities is grown to 1 μm to 5 μm on the substrate 2. For example, a GaN film doped with Si as the n type impurities at a concentration of $3 \times 10^{18}$ $cm^{-3}$ or so may be employed for the n type GaN layer 6. In the case of doping of the Si impurities, the n type GaN layer 6 is formed using trimethyl gallium (TMG), ammonia ($NH_3$) and silane ($SiH_4$) as the raw material gas. As shown in FIG. 15I, threading dislocations 46 are produced in the GaN layer which will become the n type GaN layer 6.

Figure 15J:
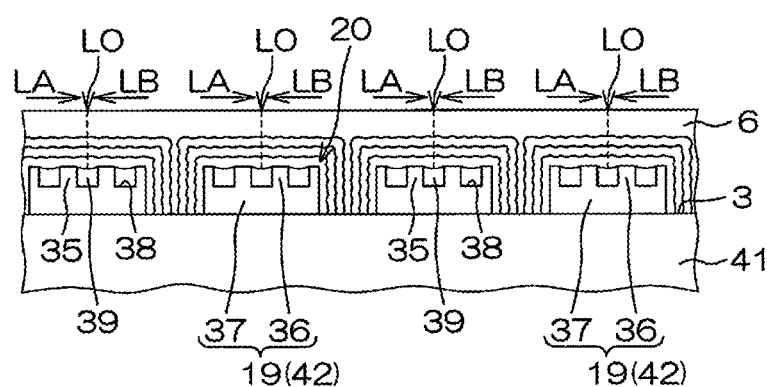
FIG. 15J is a schematic sectional view showing a step subsequent to FIG. 15I.

Next, as shown in FIG. 15J, the n type GaN layer 6 is formed by ELO (Epitaxial Lateral Overgrowth). A lateral selective epitaxial growth layer is formed on the lateral selective epitaxial growth surfaces and the n type GaN layer 6 is grown in a lateral selective epitaxial manner in the direction of vectors LA and LB in FIG. 15J. As a result, the threading dislocations 46 are accordingly bent to combine left and right selective epitaxial growth surfaces at the vicinity of the central portion LO of each convex portion 19 while adjacent threading dislocations 46 are connected to each other.

Here, as described above, since the convex pattern 20 having the micron order of convex portions 19 arranged with the occupancy of 50 to 55% is formed on the front surface 3 of the substrate 2, instead of the sub convex pattern 36 having the nano order of fine convex portions 35 arranged, sufficient seed growth of the GaN layer can be provided and gaps between convex portions 19 can be surely filled with the GaN layer.

Figure 16:
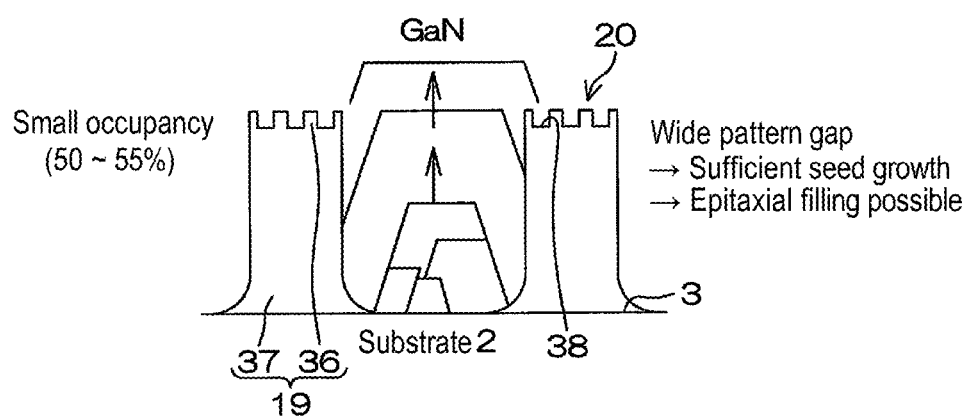
FIG. 16 is a view showing a state where seed growth is sufficient in gaps between convex portions.

In more detail, in the case of the micron order of convex pattern 20 (having an occupancy as small as 50% to 55%), sufficient seed growth can be achieved since proper gaps are defined between adjacent convex portions 19, as shown in FIG. 16.

Figure 17:
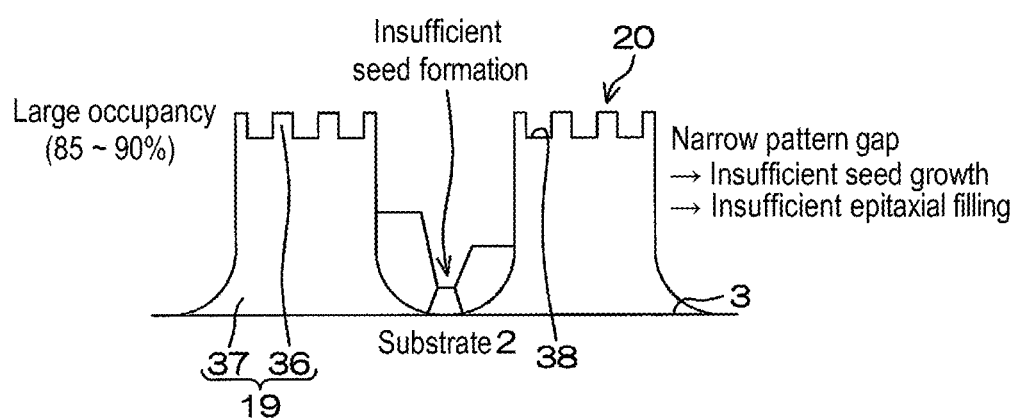
FIG. 17 is a view showing a state where seed growth is insufficient in gaps between convex portions.
Figure 18:
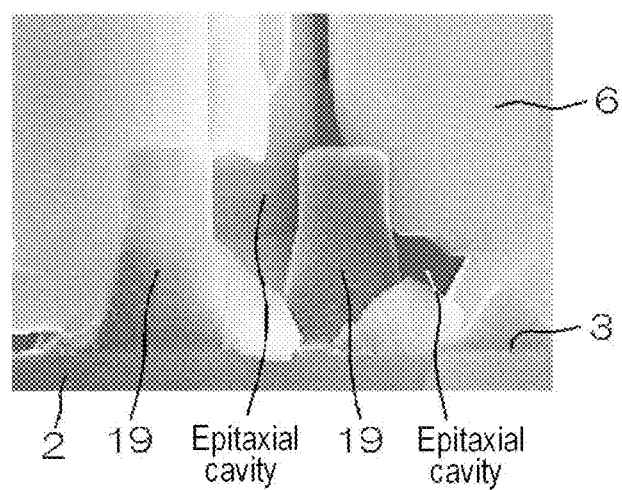
FIG. 18 is a SEM image of a state where epitaxial cavity is produced in an n type GaN layer.

In contrast, in the case of the micron order of convex pattern 20 having an occupancy as large as 85% to 90% and/or having the nano order of sub convex pattern 36, seed growth may be insufficient since gaps between adjacent convex portions 19 are too narrow to expose the front surface 3 of the substrate 2, as shown in FIG. 17. As a result, as shown in FIG. 18, it is likely that a cavity (epitaxial cavity) is formed in a portion of the n type GaN layer 6, which may result in deterioration of the n type GaN layer 6.

In this embodiment, epitaxial growth conditions may be changed to promote lateral growth during the epitaxial growth in order to completely hide the convex pattern 20 in the GaN layer 6. For example, a gas pressure during the crystalline growth may be changed to promote the lateral growth. As a first step, crystals may be grown to about 1 μm under conditions of about 1050 degrees C. and about 100 torr, and then, as a second step, the crystals may be grown to about 1.5 μm under conditions of about 1050 degrees C. and about 200 torr. By forming the n type GaN layer 6 in this manner, an effect of reduction in density of threading dislocations due to ELO can be achieved and the lateral growth can be promoted. Accordingly, since the n type GaN layer 6 is grown by the epitaxial lateral overgrowth (ELO) to cover the convex pattern 20, threading dislocations of crystals can be bent and hence crystallizability can be improved.

Figure 15K:
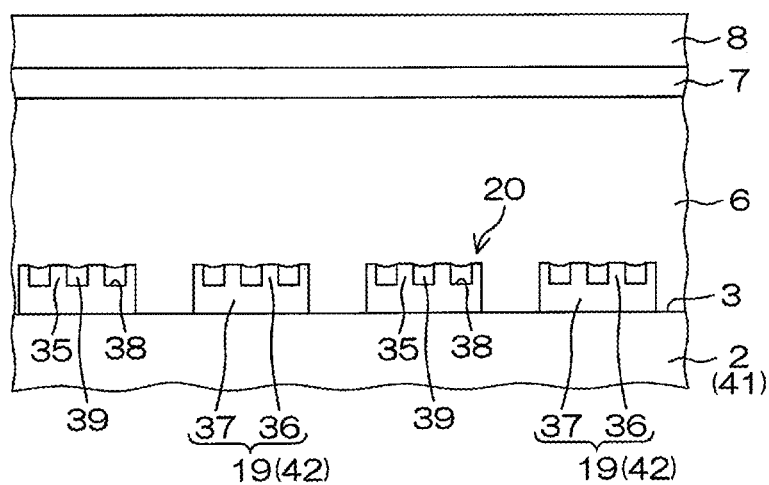
FIG. 15K is a schematic sectional view showing a step subsequent to FIG. 15J.

Next, as shown in FIG. 15K, after forming the light emitting layer 7 on the n type GaN layer 6, the p type GaN layer 8 is formed on the light emitting layer 7, thereby completing the nitride semiconductor stacked structure 9.

Thereafter, a material (ITO, etc.) of the transparent electrode layer 30 is deposited on the nitride semiconductor stacked structure 9 using, for example, a sputtering process, thereby forming the transparent electrode layer 30.

Next, the transparent electrode layer 30 and the nitride semiconductor stacked structure 9 are etched using a mask such that the nitride semiconductor stacked structure 9 is shaped into a predetermined form (a rectangular form when viewed from top) and the lead-out portion 21 corresponding to the extension of the n type GaN layer 6 is formed.

Next, the p side electrode 31 is formed on the transparent electrode layer 30 and the n side electrode 27 is formed on the lead-out portion 21 (the n type GaN layer 6). In addition, the transparent adhesive layer 10, the reflecting metal 11, the barrier metal 12 and the bonding metal 13 are formed on the rear surface 4 of the substrate 2.

Then, an external force is applied to the substrate wafer 41 to divide the substrate wafer 41 into segments (chips) of the light emitting device 1. Accordingly, segments of the light emitting device 1 of FIG. 3 can be obtained.

Figure 19:
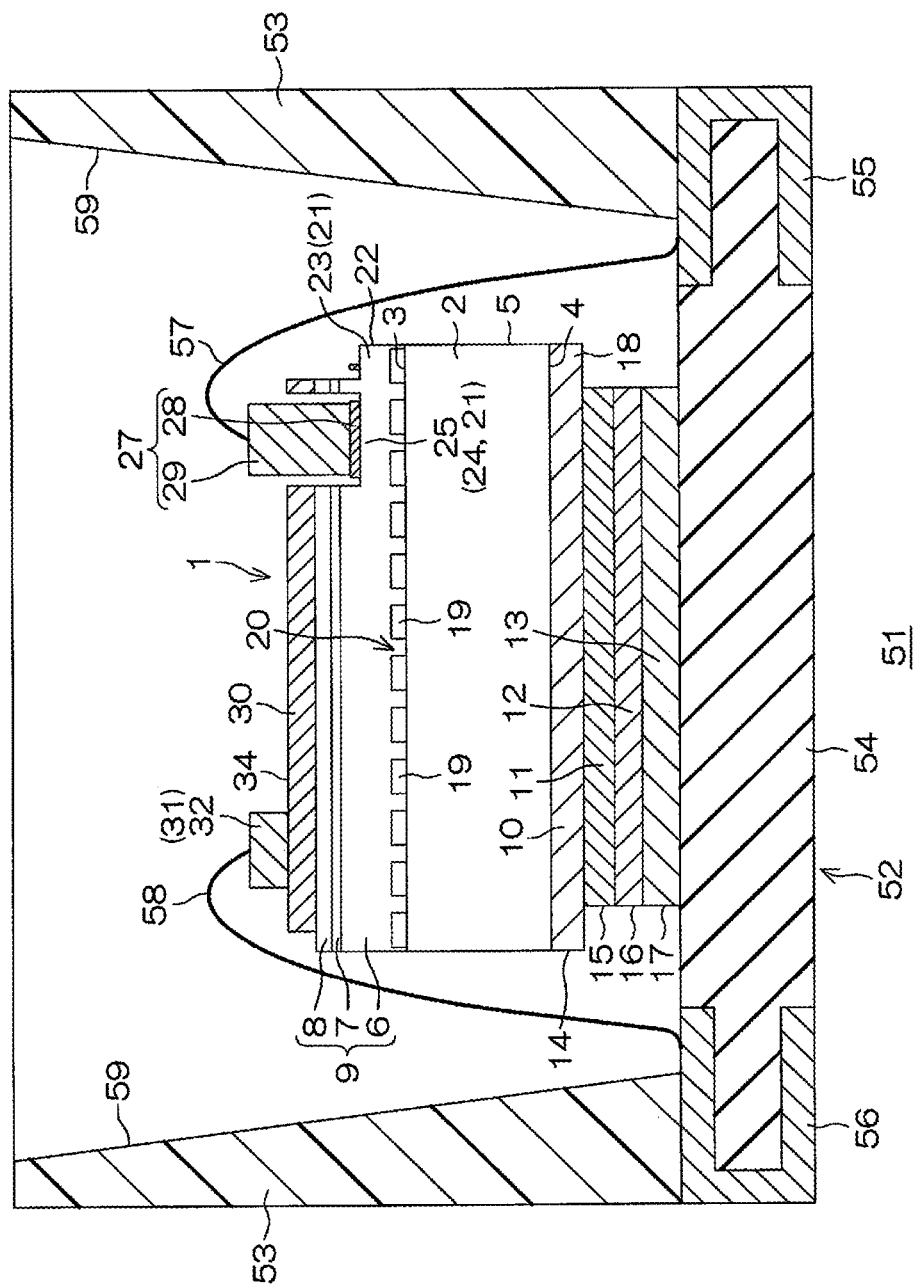
FIG. 19 is a schematic sectional view of a light emitting device package (of a face-up type).

FIG. 19 is a schematic sectional view of a light emitting device package 51 (of a face-up type).

The light emitting device package 51 includes a light emitting device 1, a support board 52 and a resin package 53.

The light emitting device 1 is disposed on the support board 52 by bonding the bonding metal 13 to the support board 52 in a face-up posture in which the front surface 3 of the substrate 2 faces upward.

The support board 52 includes an insulating substrate 54 supporting the light emitting device 1, and a pair of metal electrodes (an external n side electrode 55 and an external p side electrode 56) which is disposed to be exposed at both ends of the insulating substrate 54 and is electrically connected to the light emitting device 1.

To be specific, the n side electrode 27 (the n side pad 29) of the light emitting device 1 is connected to the external n side electrode 55 via an n side wire 57 and the p side electrode 31 (the p side pad 32) of the light emitting device 1 is connected to the external p side electrode 56 via a p side wire 58.

The resin package 53 is a case filled with resin and is fixed to the support board 52 with the light emitting device 1 received (covered) therein. The resin package 53 has a reflecting portion 59 in its lateral side (a portion facing the light emitting device 1) and reflects light emitted from the light emitting device 1 to extract the reflected light externally.

The resin in the resin package 53 may contain a fluorescent material or a reflecting agent. For example, if the light emitting device 1 emits blue light, the light emitting device package 51 can emit white light by including a yellow fluorescent material in the resin. A collection of a plurality of light emitting device packages 51 may be used for illumination devices such as light bulbs and the like, backlights of liquid crystal televisions, head lamps of vehicles, and the like.

As described above, with the above-configured light emitting device 1, when the light emitting layer 7 emits light, most of the light transmits through the p type GaN layer 8 and is extracted from the front surface 34 of the transparent electrode layer 30 (the light extraction surface), whereas some of the light transmits through the n type GaN layer 6, the substrate 2 and the transparent adhesive layer 10 in order, is reflected at the interface between the transparent adhesive layer 10 and the reflecting metal 11, and then is extracted from the light extraction surface 34.

In addition, with the above-configured light emitting device 1, since the sub convex pattern 36 is formed on the top of each convex portion 19 in the convex pattern 20, a light scattering effect superior to that with a conventional convex pattern, which is a collection of convex portions having their tops shaped in a planar form, can be achieved. Accordingly, external quantum efficiency and luminance can be improved over conventional techniques.

For a demonstration of this effect, examination was made on the relationship between occupancy and luminance of a convex pattern for three types, i.e., (1) a type of the present disclosure (hybrid type) in which the nano order ($w_2$=600 nm and $p_2$=800 nm) of sub convex pattern is formed on the top of each convex portion (base) in the micron order ($w_1$=3 μm and $p_1$=4.0 μm) of convex pattern, (2) a type (standard unevenness structure) in which the micron order ($w_1$=3 μm and $p_1$=4.0 μm) of convex pattern has a flat top, and (3) a type (nano fine unevenness structure) in which the nano order ($w_2$=600 nm and $p_2$=800 nm) of sub convex pattern is formed. Results of the examination are as shown in FIG. 20.

Figure 20:
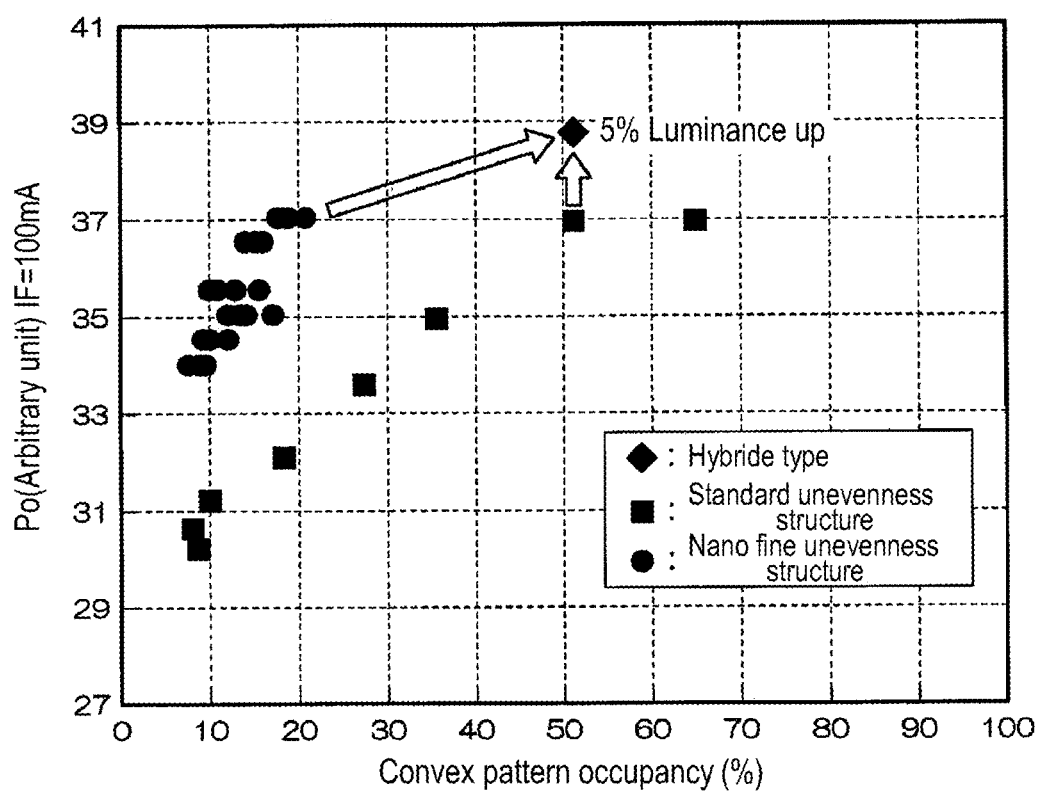
FIG. 20 is a view showing a relationship between luminance and occupancy of a convex pattern.

As shown in FIG. 20, it is to be noted that the hybrid type shows improvement in luminance by 5% over the conventional standard unevenness structure and the nano fine unevenness structure.

On the other hand, if the sub convex pattern 36 is directly formed on the front surface 3 of the substrate 2 with a high enough occupancy to obtain a high light scattering effect, seed growth of GaN between the fine convex portions 35 may be insufficient when the n type GaN layer 6 is epitaxially grown on the substrate 2 (see FIG. 17), since gaps between adjacent fine convex portions 35 are too narrow to expose the front surface 3 of the substrate 2, In the light emitting device 1 of this embodiment, the sub convex pattern 36 is supported by the base 37 of the plurality of convex portions 19 arranged with a pitch $p_1$ (for example, 4.5 μm to 5.5 μm) capable of providing sufficient seed growth of GaN, instead of directly forming the sub convex pattern 36 on the front surface 3 of the substrate 2. Accordingly, sufficient GaN seed growth can be achieved and gaps between the plurality of convex portions 19 can be surely filled with GaN. As a result, the n type GaN layer 6 covering the convex pattern 20 can be formed satisfactorily.

For demonstration of this effect, a SEM image was taken at the vicinity of a convex pattern of the hybrid type in the above-described experiment to verify a filling state of the n type GaN layer. The SEM image is as shown in FIG. 21.

Figure 21:
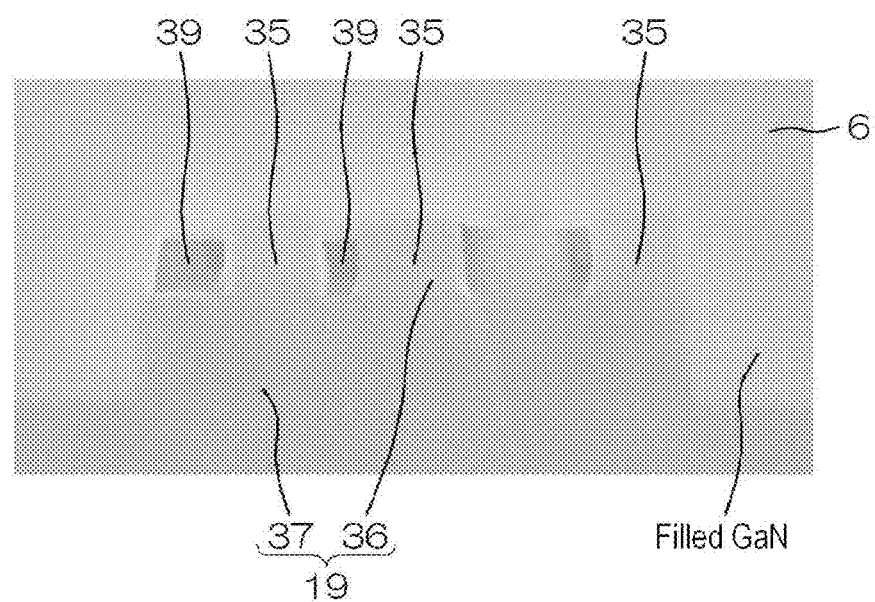
FIG. 21 is a SEM image taken in the vicinity of a hybrid type convex pattern.

It can be noted from FIG. 21 that gaps between adjacent convex portions 19 are surely filled with GaN and the n type GaN layer 6 spans between tops of fine convex portions 35, thereby forming spaces 39 partitioned by the n type GaN layer 6 and the fine convex portions 35. When the spaces 39 (having a refractive index $n_{Air}$ of approximately 1) as shown in FIG. 21 exist between the fine convex portions 35, the light scattering effect due to the sub convex pattern 36 can be further improved.

In other words, the light emitting device 1 of this embodiment can further improve the external quantum efficiency over the conventional techniques while forming the n type GaN layer 6 covering the convex pattern 20 satisfactorily.

Figure 22:
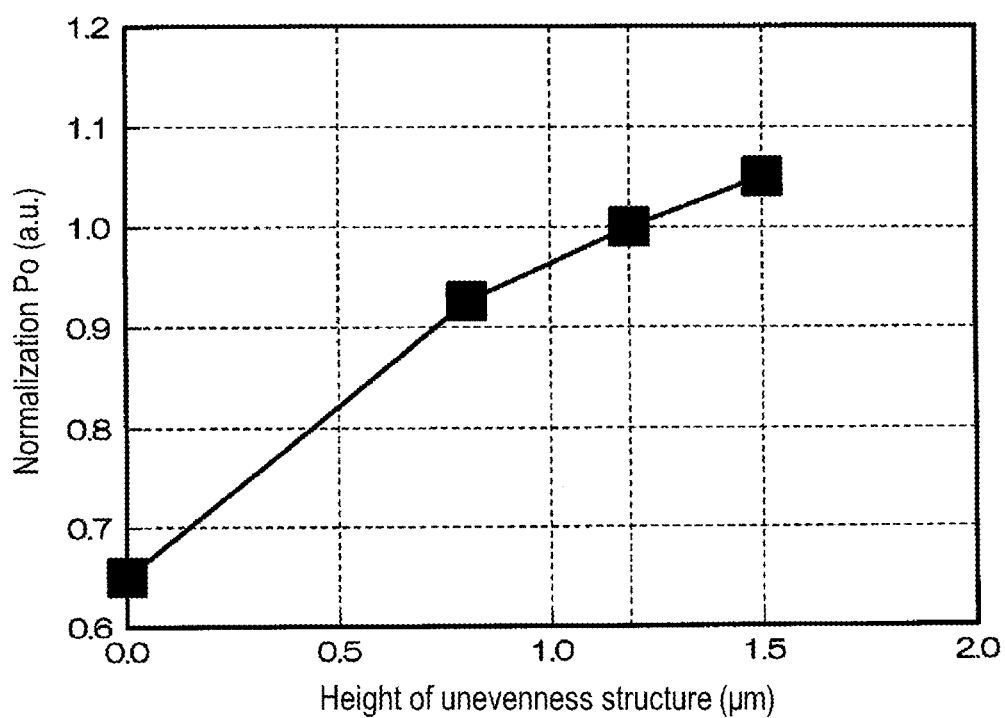
FIG. 22 is a graph showing a change in luminance depending on a height of an unevenness structure.

In addition, FIG. 22 shows results of examination on change of luminance depending on the height H of the convex portions 19 of the hybrid type of the above-described experiment. It can be seen from FIG. 22 that the luminance as the height H increases.

While the some example embodiments of the present disclosure have been described above, the present disclosure may be practiced in other different forms.

For example, the idea of the present disclosure may be applied to a face-down type (flip-chip type) light emitting device 61 as shown in FIG. 23.

The light emitting device 61 is different from the face-up type light emitting device 1 in that metal such as a reflecting metal 62 is formed on the front surface of the p type GaN layer 8, instead of the rear surface 4 of the substrate 2, via a transparent electrode layer 63.

With this configuration, in a light emitting device package 64, when the light emitting layer 7 emits light, most of the light transmits through the n type GaN layer 6 and is extracted from the substrate 2, whereas some of the light transmits through the p type GaN layer 8 and the transparent electrode layer 63 in order and is reflected at the interface between the transparent electrode layer 63 and the reflecting metal 62 and then extracted from the substrate 2.

<Additional Features of Present Disclosure>

The present disclosure includes the following features.

As a first feature, the present disclosure provides a face-up type light emitting device including: a substrate having a front surface as a light extraction surface of the light emitting device and a rear surface opposite the front surface, the substrate being transparent to an emission wavelength of a light emitting layer; a nitride semiconductor stacked structure including an n type nitride semiconductor layer, the light emitting layer and a p type nitride semiconductor layer, which are stacked in order on the front surface of the substrate; a transparent adhesive layer formed on the rear surface of the substrate; a reflecting metal made of an alloy containing Ag, a Pt group metal and Cu and formed on a rear surface of the transparent adhesive layer in contact with the transparent adhesive layer, the reflecting metal reflecting light transmitting through the transparent adhesive layer toward the front surface of the substrate; and a bonding metal formed on a rear surface of the reflecting metal.

As a second feature of the present disclosure, in the light emitting device according to the first feature, the reflecting metal and the bonding metal are formed to be accommodated in the rear surface of the transparent adhesive layer such that the rear surface of the substrate or the rear surface of the transparent adhesive layer is selectively exposed when the light emitting device is viewed from the opposite side of the light extraction surface.

As a third feature of the present disclosure, in the light emitting device according to the first feature, the light emitting device includes: a lead-out portion extending from the nitride semiconductor stacked structure in parallel to the substrate and electrically connected to the n type nitride semiconductor layer; an n side electrode formed on the lead-out portion; a transparent electrode layer formed on the p type nitride semiconductor layer; and a p side electrode formed on the transparent electrode layer.

As a fourth feature of the present disclosure, in the light emitting device according to the first aspect, the reflecting metal is formed of an AgPdCu alloy in which Pd is the Pt group metal.

As a fifth feature of the present disclosure, in the light emitting device according to the fourth feature, the mixing ratio of Pd and Cu in the reflecting metal are 0.6% and 0.2%, respectively.

As a sixth feature of the present disclosure, in the light emitting device according to the first feature, the reflecting metal is formed of an AgPtCu alloy in which Pt is the Pt group metal.

As a seventh feature of the present disclosure, in the light emitting device according to the first feature, the transparent adhesive layer is formed of ITO or ZnO.

As an eighth feature of the present disclosure, in the light emitting device according to the first feature, the bonding metal is formed of Ag, solder or an AuSn alloy.

As a ninth feature of the present disclosure, in the light emitting device according to the first feature, the light emitting device further includes a barrier metal interposed between the reflecting metal and the bonding metal.

As a tenth feature of the present disclosure, in the light emitting device according to the ninth feature, the barrier metal is formed of a TiW alloy.

As an eleventh feature of the present disclosure, in the light emitting device according to the first feature, the thickness of the substrate is 200 μm to 300 μm.

As a twelfth feature of the present disclosure, in the light emitting device according to the first feature, the substrate is formed of sapphire, GaN or SiC.

As a thirteenth feature of the present disclosure, in the light emitting device according to the first feature, the emission wavelength is 450 nm.

As a fourteenth feature of the present disclosure, in the light emitting device according to the first feature, the light emitting device further include a convex pattern composed of a collection of a plurality of convex portions discretely arranged on the front surface of the substrate at certain distances.

As a fifteenth feature of the present disclosure, in the light emitting device according to the fourteenth feature, the plurality of convex portions is arranged in a matrix form.

As a sixteenth feature of the present disclosure, in the light emitting device according to the fourteenth feature, the plurality of convex portions is arranged in a zigzag pattern.

A seventeenth feature of the present disclosure provides a light emitting device package including: the light emitting device according to the first feature; and a resin package covering the light emitting device with the light emitting device being in a face-up posture in which the light extraction surface directs upward.

As an eighteenth feature of the present disclosure, in the light emitting device package according to the seventeenth feature, the light emitting device package includes the light emitting device according to the third feature or the light emitting device according to any one of the fourth to the sixteenth features relating to the third feature, and the light emitting device package further includes: an external n side electrode and an external p side electrode; an n side wire connecting the n side electrode and the external n side electrode; and a p side wire connecting the p side electrode and the external p side electrode.

A nineteenth feature of the present disclosure provides a method of manufacturing a face-up type light emitting device, including: forming a nitride semiconductor stacked structure by stacking an n type nitride semiconductor layer, a light emitting layer and a p type nitride semiconductor layer in order on a front surface of a substrate wafer, the substrate wafer having the front surface as a light extraction surface and a rear surface opposite the front surface and being transparent to an emission wavelength of the light emitting layer; forming a transparent adhesive layer on the entire rear surface of the substrate wafer; depositing a reflecting metal on the entire rear surface of the transparent adhesive layer, the reflecting metal being formed of an alloy containing Ag, a Pt group metal and Cu; forming a bonding metal on a rear surface of the reflecting metal such that a portion of the reflecting metal is selectively exposed along a planned cutting line of the substrate wafer; selectively exposing a portion of the transparent adhesive layer along the planned cutting line by removing the exposed portion of the reflecting metal by etching; forming a division guide groove along the planned cutting line on the exposed transparent adhesive layer and the substrate wafer by a process from the rear surface of the substrate wafer; and dividing the substrate wafer along the division guide groove.

A twentieth feature of the present disclosure provides a method of manufacturing a face-up type light emitting device, including: forming a nitride semiconductor stacked structure by stacking an n type nitride semiconductor layer, a light emitting layer and a p type nitride semiconductor layer in order on a front surface of a substrate wafer, the substrate wafer having the front surface as a light extraction surface and a rear surface opposite the front surface and being transparent to an emission wavelength of the light emitting layer; forming a transparent adhesive layer on the entire rear surface of the substrate wafer; forming a mask on a rear surface of the transparent adhesive layer to selectively cover a portion of the transparent adhesive layer along a planned cutting line of the substrate wafer; depositing a reflecting metal and a bonding metal on the mask and the transparent adhesive layer exposed from the mask, the reflecting metal being formed of an alloy containing Ag, a Pt group metal and Cu; lifting off, together with the mask, a portion of the reflecting metal and the bonding metal on the mask and leaving the reflecting metal and the bonding metal to selectively expose a portion of the transparent adhesive layer along the planned cutting line; forming a division guide groove along the planned cutting line on the exposed transparent adhesive layer and the substrate wafer by a process from the rear surface of the substrate wafer; and dividing the substrate wafer along the division guide groove.

While certain embodiments have been described, these embodiments have been presented by way of example only, and are not intended to limit the scope of the disclosures. Indeed, the novel methods and devices described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A light emitting device, comprising:
a substrate having a front surface on which a plurality of protruding portions are formed;
a first semiconductor layer of a first conductivity type formed to cover the plurality of protruding portions;
a light emitting layer formed over the first semiconductor layer;
a first electrode formed over the first semiconductor layer, and not contacting the light emitting layer;
a second semiconductor layer of a second conductivity type formed over the light emitting layer; and
a second electrode formed over the second semiconductor layer,
wherein the plurality of protruding portions are made of a same material,
wherein a portion of the front surface of the substrate, which is located between the plurality of protruding portions, is flatter than surfaces of the plurality of protruding portions, and
wherein side surfaces of each of the plurality of protruding portions are concave in a cross-sectional view.

2. The light emitting device of claim 1, wherein the second electrode includes a first material which reflects a light emitted from the light emitting layer.

3. The light emitting device of claim 2, wherein the first material includes Ag, solder, or AuSn alloy.

4. The light emitting device of claim 1, wherein a distance between a surface of the first electrode furthest from the substrate and the front surface of the substrate is longer than a distance from a surface of the second semiconductor layer and the front surface of the substrate.

5. The light emitting device of claim 1, wherein at least a portion of a side surface of the first electrode faces at least a portion of a side surface of the second electrode.

6. The light emitting device of claim 1, further comprising a first conductive layer formed over a rear surface of the substrate, and made of a first material which reflects a light emitted from the light emitting layer.

7. The light emitting device of claim 6, wherein the first material includes ITO (Indium Tin Oxide) or ZnO (zinc oxide).

8. The light emitting device of claim 6, wherein the first conductive layer is formed to be located within a peripheral edge of the substrate in a direction perpendicular to the front surface of the substrate.

9. The light emitting device of claim 1, further comprising an external electrode which directly contacts the first electrode.

10. The light emitting device of claim 1, further comprising an external electrode which directly contacts the second electrode.

11. The light emitting device of claim 1, wherein a side surface of the first electrode extends along an entire side of the second semiconductor layer.

12. The light emitting device of claim 1, wherein a first distance between a surface of the first electrode furthest from the substrate and the front surface of the substrate is equal to a second distance between a surface of the second electrode furthest from the substrate and the front surface of the substrate.

13. The light emitting device of claim 1, further comprising a reflecting metal formed between the second semiconductor layer and the second electrode.

14. The light emitting device of claim 1, further comprising a transparent electrode layer formed between the second semiconductor layer and the second electrode.

15. The light emitting device of claim 1, wherein an angle of an inclination at a point of each side surface of the plurality of protruding portions becomes greater as the point becomes higher.

16. The light emitting device of claim 1, wherein each of the plurality of protruding portions includes a plurality of fine protruding portions, and
   wherein the first semiconductor layer covers the plurality of protruding portions and spans between tops of the fine protruding portions to form spaces partitioned by the first semiconductor layer and the fine protruding portions.

17. The light emitting device of claim 1, wherein the second electrode is formed to overlap a portion of the light emitting layer.

* * * * *